US012094851B2

(12) United States Patent
Cok

(10) Patent No.: US 12,094,851 B2
(45) Date of Patent: Sep. 17, 2024

(54) PARTICLE CAPTURE USING TRANSFER STAMP

(71) Applicant: X Display Company Technology Limited, Dublin (IE)

(72) Inventor: Ronald S. Cok, Rochester, NY (US)

(73) Assignee: X Display Company Technology Limited, Dublin (IE)

( * ) Notice: Subject to any disclaimer, the term of this patent is extended or adjusted under 35 U.S.C. 154(b) by 0 days.

(21) Appl. No.: 18/132,199

(22) Filed: Apr. 7, 2023

(65) Prior Publication Data
US 2023/0245998 A1    Aug. 3, 2023

Related U.S. Application Data

(62) Division of application No. 16/918,995, filed on Jul. 1, 2020, now Pat. No. 11,652,082.

(60) Provisional application No. 62/883,007, filed on Aug. 5, 2019.

(51) Int. Cl.
*H01L 21/683* (2006.01)
*B41F 16/00* (2006.01)
*H01L 21/67* (2006.01)
*H01L 23/00* (2006.01)

(52) U.S. Cl.
CPC .......... *H01L 24/83* (2013.01); *B41F 16/0046* (2013.01); *H01L 21/67092* (2013.01); *H01L 21/6835* (2013.01); *H01L 2221/68368* (2013.01); *H01L 2224/75303* (2013.01)

(58) Field of Classification Search
CPC ............... H01L 24/83; H01L 21/67092; H01L 21/6835; H01L 2221/68368; H01L 2224/75303; H01L 25/0753; H01L 21/67144; B41F 16/0046
USPC ........................................................ 437/107
See application file for complete search history.

(56) References Cited

U.S. PATENT DOCUMENTS

| 6,979,032 | B2 * | 12/2005 | Damhuis | B65G 47/917 294/185 |
|---|---|---|---|---|
| 7,354,801 | B2 * | 4/2008 | Sugiyama | H01L 27/1214 438/460 |
| 7,622,367 | B1 | 11/2009 | Nuzzo et al. | |
| 7,964,439 | B2 * | 6/2011 | Kim | H10K 71/13 438/455 |
| 8,506,867 | B2 | 8/2013 | Menard | |
| 8,889,485 | B2 | 11/2014 | Bower | |
| 9,087,764 | B2 * | 7/2015 | Chan | H01L 24/05 |
| 9,105,714 | B2 * | 8/2015 | Hu | H01L 24/95 |
| 9,161,448 | B2 * | 10/2015 | Menard | H01L 27/1266 |
| 9,178,123 | B2 * | 11/2015 | Sakariya | H01L 33/06 |

(Continued)

*Primary Examiner* — Vu A Vu
(74) *Attorney, Agent, or Firm* — Choate, Hall & Stewart LLP; Michael D. Schmitt

(57) ABSTRACT

A micro-transfer printing system comprises a source substrate having a substrate surface and components disposed in an array on, over, or in the substrate surface Each component has a component extent in a plane parallel to the substrate surface. A stamp comprises a stamp body and stamp posts extending away from the stamp body disposed in an array over the stamp body. Each of the stamp posts has (i) a post location corresponding to a component location of one of the components when the stamp is disposed in alignment with the source substrate, and (ii) a post surface extent on a distal end of the stamp post. The post surface extent is greater than the component extent.

22 Claims, 19 Drawing Sheets

(56) References Cited

U.S. PATENT DOCUMENTS

| | | | |
|---|---|---|---|
| 9,209,348 B2 * | 12/2015 | Hu | H01L 33/62 |
| 9,217,541 B2 * | 12/2015 | Bathurst | H01L 21/7806 |
| 9,358,775 B2 * | 6/2016 | Bower | H01L 21/3065 |
| 9,554,484 B2 * | 1/2017 | Rogers | H05K 1/189 |
| 9,640,715 B2 * | 5/2017 | Bower | H01L 33/0095 |
| 9,761,754 B2 * | 9/2017 | Bower | H01L 25/50 |
| 9,786,646 B2 | 10/2017 | Cok et al. | |
| 9,969,078 B2 * | 5/2018 | Chen | H01L 24/75 |
| 10,262,966 B2 | 4/2019 | Bower | |
| 10,438,859 B2 | 10/2019 | Cok et al. | |
| 10,468,363 B2 | 11/2019 | Prevatte et al. | |
| 10,899,067 B2 | 1/2021 | Moore et al. | |
| 11,145,788 B2 * | 10/2021 | Ahn | H01L 33/0095 |
| 11,652,082 B2 | 5/2023 | Cok | |
| 2016/0020127 A1 | 1/2016 | Bower et al. | |
| 2018/0286734 A1 | 10/2018 | Meitl et al. | |
| 2021/0039380 A1 | 2/2021 | Cok | |

* cited by examiner

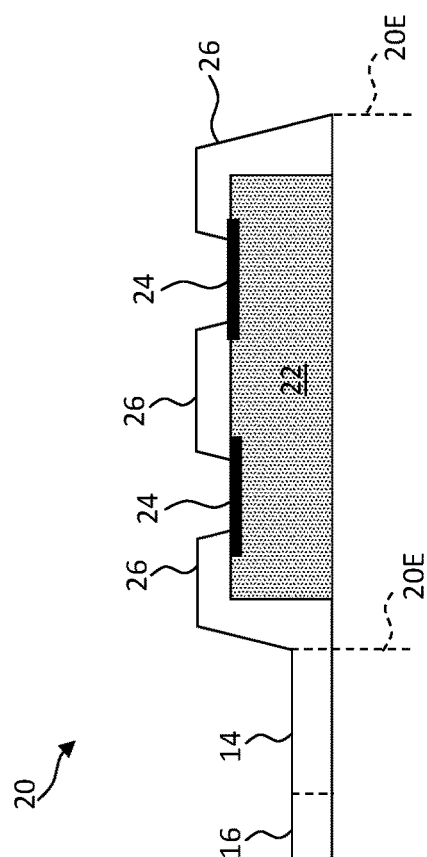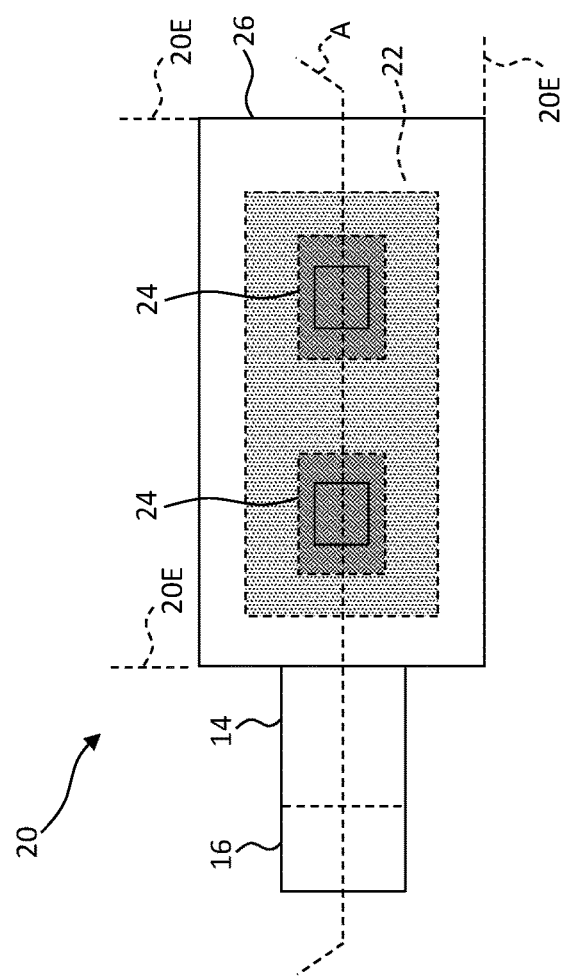

PARTICLE CAPTURE USING TRANSFER STAMP

PRIORITY APPLICATION

This application is a continuation of U.S. patent application Ser. No. 16/918,995, filed on Jul. 1, 2020, which claims the benefit of U.S. Provisional Patent Application No. 62/883,007, filed on Aug. 5, 2019, the disclosure of each of which is hereby incorporated by reference herein in its entirety.

TECHNICAL FIELD

The present disclosure relates to transfer printing and stamps used in transfer printing, for example micro-transfer printing.

BACKGROUND

The disclosed technology relates generally to methods and tools for transfer printing. Conventional methods such as pick-and-place for applying integrated circuits to a destination (target) substrate are limited to relatively large components, for example having a dimension of a millimeter or more, and it can be very difficult to pick up and place ultra-thin, fragile, or small components using such conventional technologies. More recently, micro-transfer printing methods have been developed that permit the selection and application of such ultra-thin, fragile, or small components to a target substrate without causing damage to the components themselves.

Micro-transfer printing enables deterministically removing arrays of micro-scale, high-performance components from a native source wafer, typically a semiconductor wafer on which the components are constructed, and assembling and integrating the components onto non-native target substrates. In some embodiments, micro-transfer printing processes use engineered elastomer stamps coupled with high-precision motion-controlled print-heads to selectively pick up and print large arrays of micro-scale components from a source native wafer onto non-native destination substrates. In some embodiments, tethers are used to maintain position and alignment of components on a source wafer prior to the pick-up phase of a print operation and are broken or separated during the pick-up phase. In some embodiments, adhesion between an elastomer transfer device and a printable component can be selectively tuned by varying the speed of a print-head.

Micro-structured stamps may be used to pick up micro components from a source substrate, transport the micro components to their destination (e.g., a destination substrate), and print the micro components onto a destination substrate. The transfer device (e.g., a micro-structured stamp) can be created using various materials. Individual posts on a transfer device can pick up corresponding individual components and then print the corresponding components to their destination. Posts can be structured in an array fashion and can have a range of heights depending on the size of the printable material. For effective, high-yield printing, when picking up components, it is desirable to use a stamp having stamp posts that are engineered to be in close contact with the components (e.g., micro integrated circuits) being printed. High-yield printing includes low percentages of missing or misplaced components. Some print operations do result in a certain, albeit low, percentage of misplaced or missing components.

There is a need, therefore, for stamps and methods of printing that further improve high-yields of printing components such as semiconductor circuits and devices.

SUMMARY

While micro-transfer printing using an elastomeric stamp typically has a high yield, there are also commonly a small number of misprinted components. Components can be misprinted because they are misplaced, misaligned, misconnected (e.g., electrically), or totally missing (e.g., dropped during transfer or never properly picked up). Misprinted components can occur in embodiments where tethers are used to maintain position and alignment of components on a source wafer and subsequently broken or separated during pick up by a transfer device. It is desirable to improve the high yields of micro-transfer printing, including when tethers are used, in order to reduce or eliminate the number of repair print operations that are needed to replace or otherwise fix misprinted components.

The present disclosure includes the recognition that, in some embodiments where tethers are used, particles formed from breaking or separating tethers can interfere with proper pick up and/or printing of components. Such particles can become airborne after formation and interfere with, for example, subsequent print operations using the same source wafer. For example, particles can become deposited on contact surfaces of adjacent (or nearby) components such that adherence of stamp posts during a subsequent print operation is impaired. As another example, particle(s) can become deposited on a component such that electrical connection between the component and a destination substrate or intermediate substrate is impaired after or during printing. In yet another example, particle(s) can become deposited on the picked-up component, interfering with printing the component.

A solution that can be used in some embodiments is to use a stamp with oversized posts (relative to components being printed) such that each post overhangs and extends beyond its corresponding component during pick up in a direction substantially parallel to a surface of the source wafer. Such posts can more readily capture particles formed during breaking or separating tethers during component pick up. Elastomer stamp posts are well suited to capturing such particles because the particles will generally readily adhere thereto and particle capture can occur while print operations proceed as normal. In some embodiments, posts that are oversized specifically over a pre-determined tether location can be used. Posts can be cleaned between print operations to remove adhered particles and thereby be prepared for subsequent prints. Embodiments of the present disclosure provide systems, methods, and devices for reducing or capturing transfer printing (e.g., micro-transfer printing) particulate contamination, thereby increasing the transfer printing yield.

In certain embodiments of the present disclosure, a micro-transfer printing system comprises a source substrate having a substrate surface, components disposed in an array on, over, or in the substrate surface, each component having a component extent in a plane parallel to the substrate surface, a stamp comprising a stamp body and stamp posts extending away from the stamp body and disposed in an array over the stamp body, each of the stamp posts having (i) a post location corresponding to a component location of one of the components when the stamp is disposed in alignment with the source substrate, and (ii) a post surface extent on a distal end of the stamp post, wherein the post surface extent is greater than the component extent. The post surface extent can be greater than or equal to 105% (e.g., greater than or equal to 110%, greater than or equal to 120%, greater than or equal to 150%, or greater than or equal to 200%) of the component extent.

In some embodiments, each of the components is spaced apart from each nearest-neighbor component by at least a component separation distance and each of the stamp posts is spaced apart from each nearest-neighbor stamp post by at most a post separation distance, and the post separation distance is less than the component separation distance.

Some embodiments of a micro-transfer printing system comprise sacrificial portions disposed in an array over the source substrate and (i) each of the components is disposed completely over a different corresponding sacrificial portion of the sacrificial portions and (ii) each different corresponding sacrificial portion has a sacrificial portion extent (e.g., an area) greater than the component extent. The post surface extent can be less than the sacrificial portion extent.

In some embodiments of the present disclosure, each of the stamp posts extends at least one quarter of a distance (e.g., at least half of the distance or at least three quarters of the distance) from each component edge of one of the components to a corresponding sacrificial portion edge of the different corresponding sacrificial portions. The post surface extent can be less than or equal to 90% (e.g., less than or equal to 80%, less than or equal to 70%, less than or equal to 60%, less than or equal to 50%, less than or equal to 40%, less than or equal to 30%, or less than or equal to 20%) of the sacrificial portion extent. The post surface extent can be greater than or equal to the sacrificial portion extent or the post surface extent can cover the sacrificial portion extent.

According to some embodiments of the present disclosure, any one or all of (i) the sacrificial portions are laterally separated by anchors, (ii) each component in the array of components is physically connected to one of the anchors with a tether, and (iii) each of the stamp posts extends over at least a portion of the tether physically connecting the one of the components to the one of the anchors. In some embodiments, the sacrificial portions are laterally separated by anchors and each of the stamp posts extends laterally at least partially over a corresponding anchor of the anchors when the stamp is disposed in alignment with the source substrate.

In some embodiments, each of the stamp posts comprises a lateral post protrusion. The lateral post protrusion can extend at least partially over the corresponding tether or can extend at least partially over the corresponding anchor when the stamp is disposed in alignment with the source substrate, or both. According to some embodiments of the present disclosure, each of the components is physically connected to a tether and the lateral post protrusion is sized and shaped to extend laterally over at least a portion of or all of the tether. The lateral post protrusion can have a length-to-width aspect ratio of at least 0.5 (e.g., at least 1.0, 1.5 or 2.0).

In some embodiments, each of the stamp posts comprises a step. The step can extend laterally beyond each edge of the distal end of the stamp post. In some embodiments, each of the stamp posts comprises a step and the step comprises a lateral post protrusion.

According to some embodiments of the present disclosure, a method of micro-transfer printing comprises: providing a source substrate comprising sacrificial portions disposed in an array over the source substrate, the sacrificial portions laterally separated by anchors; providing a component disposed directly on or over each of the sacrificial portions and physically connected to an anchor with a tether, each component having a component extent and spaced apart from a neighboring component by a component separation distance; providing a stamp comprising a stamp body and stamp posts extending away from the stamp body and disposed in an array over the stamp body, each of the stamp posts having a post surface extent on a distal end of the stamp post, wherein the post surface extent is greater than the component extent; positioning the stamp to locate each stamp post in alignment with a corresponding component and pressing each of the stamp posts against the corresponding component to adhere the corresponding component to the stamp post; and removing the stamp from the source substrate, thereby fracturing the tether physically connecting the corresponding component and making particles (e.g., discrete grains) that subsequently adhere to the stamp. According to some embodiments, the method comprises: providing a destination substrate; transferring the stamp and adhered components to the destination substrate; pressing the components to the destination substrate with the stamp, to adhere the components to the destination substrate; and removing the stamp. The stamp can be cleaned to remove the particles from the stamp after removing the stamp. In some methods, at least a portion of the particles adhere to the distal end of the stamp post (e.g., on a post surface that contacts the corresponding component at the distal end of the stamp post, for example on a portion of the distal end that overhangs or extends beyond the picked-up component). The stamp post can comprise a step and at least a portion of the particles adhere to the step.

According to some methods, the stamp post comprises a lateral protrusion and positioning the stamp comprises positioning the lateral protrusion over one of the at least one tether, wherein at least a portion of the particles adhere to the lateral protrusion.

According to some embodiments of the present disclosure, a method of transfer printing a component comprises providing a stamp comprising a stamp post, the stamp post having a post surface extent on a distal end of the stamp post; providing a component disposed on a source substrate, wherein the component is physically connected to the source substrate by at least one tether and the component has a component extent that is smaller than the post surface extent; and removing the component from the source substrate, wherein removing the component comprises contacting the component to the stamp post and breaking (e.g., fracturing) or separating the at least one tether thereby causing particles (e.g., discrete grains) to form, and wherein at least a portion of the particles adhere to the stamp post while the stamp post is in contact with the component. At least a portion of the particles can adhere to the distal end of the stamp post while the stamp post is in contact with the component (e.g., on a post surface that contacts the corresponding component at the distal end of the stamp post, for example on a portion of the distal end that overhangs or extends beyond the picked-up component).

According to some embodiments, the stamp post comprises a step and at least a portion of the particles adhere to the step while the stamp post is in contact with the component. The stamp post can comprise a lateral post protrusion and the method can comprise positioning the lateral post protrusion over one of the at least one tether, wherein at least a portion of the particles adhere to the lateral protrusion while the stamp post is in contact with the component.

According to some embodiments, a method comprises: transferring the component from the source substrate to a destination substrate; pressing the component to the destination substrate; and separating the stamp from the component, wherein at least a portion of the particles are made airborne as a result of the separation and subsequently adhere to the stamp post. The method can comprise cleaning the stamp to remove the at least a portion of the particles from the stamp after removing the stamp.

In some embodiments, a sacrificial portion is disposed between the component and the source substrate and the method comprises etching the sacrificial portion so that the component is suspended over the source substrate by the at least one tether, each of the at least one tether being connected to an anchor adjacent to the sacrificial portion.

According to some embodiments of the present disclosure, a stamp for micro-transfer printing comprises a stamp body and stamp posts extending away from the stamp body disposed in an array over the stamp body, wherein each of the stamp posts comprises a lateral post protrusion, a step, or both a lateral post protrusion and a step. The step can extend laterally beyond each edge of the distal end of the stamp post. The lateral post protrusion can have a length-to-width aspect ratio of at least 0.5 (e.g., at least 1.0, 1.5 or 2.0).

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 1B is a plan view corresponding to the micro-transfer printing system of FIG. 1A and illustrating cross-section line A along which FIG. 1A is illustrated;

FIG. 2A is a cross section of a component structure according to illustrative embodiments of the present disclosure;

FIG. 2B is a plan view corresponding to the component structure of FIG. 2A and illustrating cross-section line A along which FIG. 2A is illustrated;

Figure 1A:
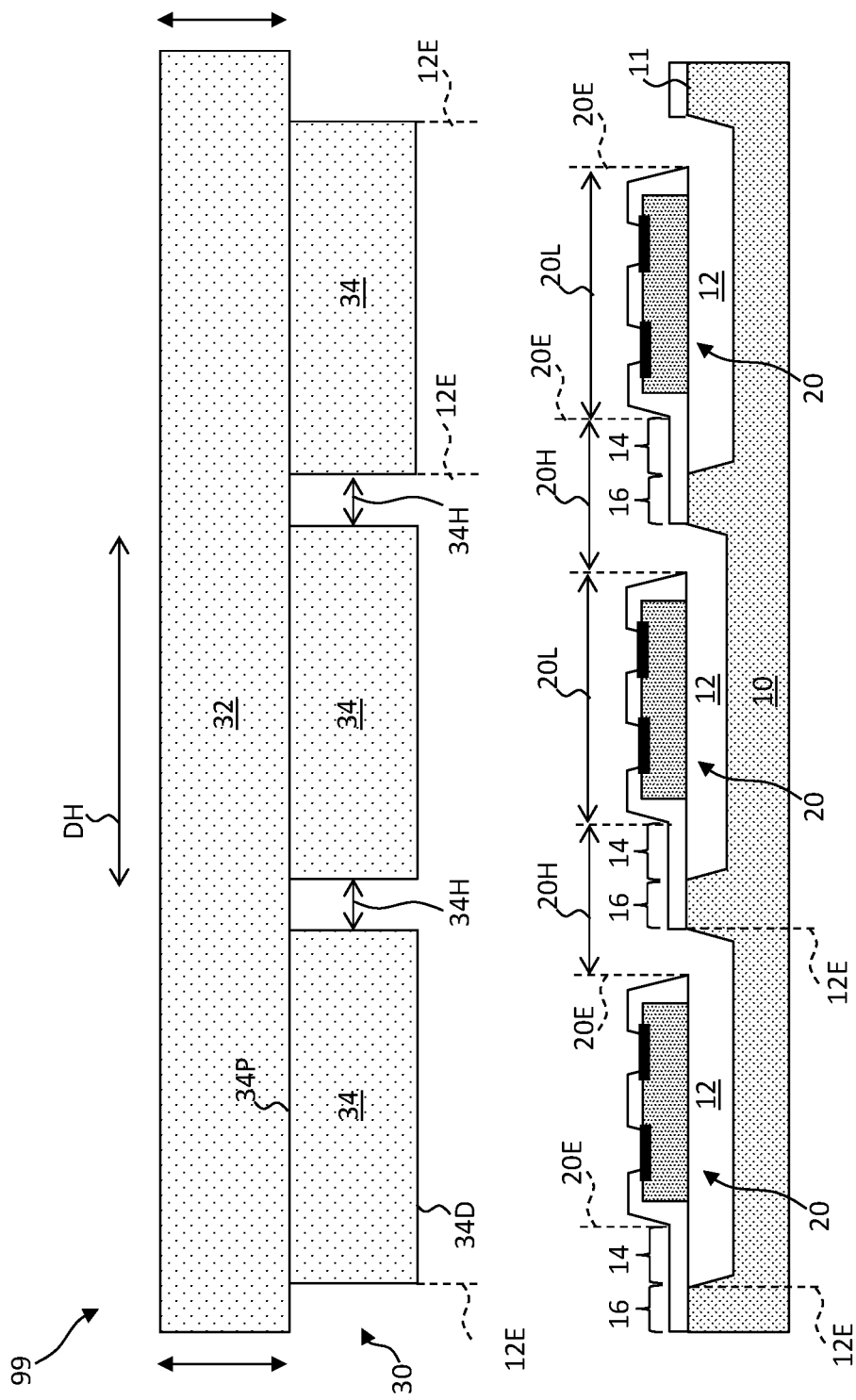
FIG. 1A is a cross section of a micro-transfer printing system having stamp areas and sacrificial areas of the same size according to illustrative embodiments of the present disclosure.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, or structurally similar elements. The figures are not necessarily drawn to scale since the variation in size of various elements in the Figures is too great to permit depiction to scale.

DETAILED DESCRIPTION OF CERTAIN EMBODIMENTS

The present disclosure provides structures and methods that enable, inter alia, transfer printing of components from a source substrate to a target substrate with improved transfer yields (and reduced transfer failures) providing a more robust manufacturing process with improved product yield (e.g., reducing or eliminating the need for repair print operation). Transfer printing can be micro-transfer printing, components can be micro-components, for example having at least one of a length or width less than or equal to 200 microns, and a source substrate can be a native component source wafer, such as a semiconductor wafer, having an extensive surface, for example having a dimension (for example a diameter) greater than or equal to 10 cm, 15 cm, 20 cm, 25 cm, 30 cm, 40 cm, or even larger. Target substrates can be any destination substrate, such as a display substrate, and can comprise any useful substrate material, such as glass, ceramic, metal, or polymer. A target substrate can be an intermediate substrate, for example used as part of a compound micro assembly process. Components can be formed on a source substrate, contacted by a stamp to pick up and remove them from the source substrate and adhere them to the stamp, and pressed against a target substrate to adhere the components to a target substrate. The stamp is then moved away from the target substrate, leaving the components on the target substrate. The pickup-and-print process (print operation) can be repeated (e.g., many times) with the stamp to transfer different components on the source substrate to the target substrate.

Figure 7:
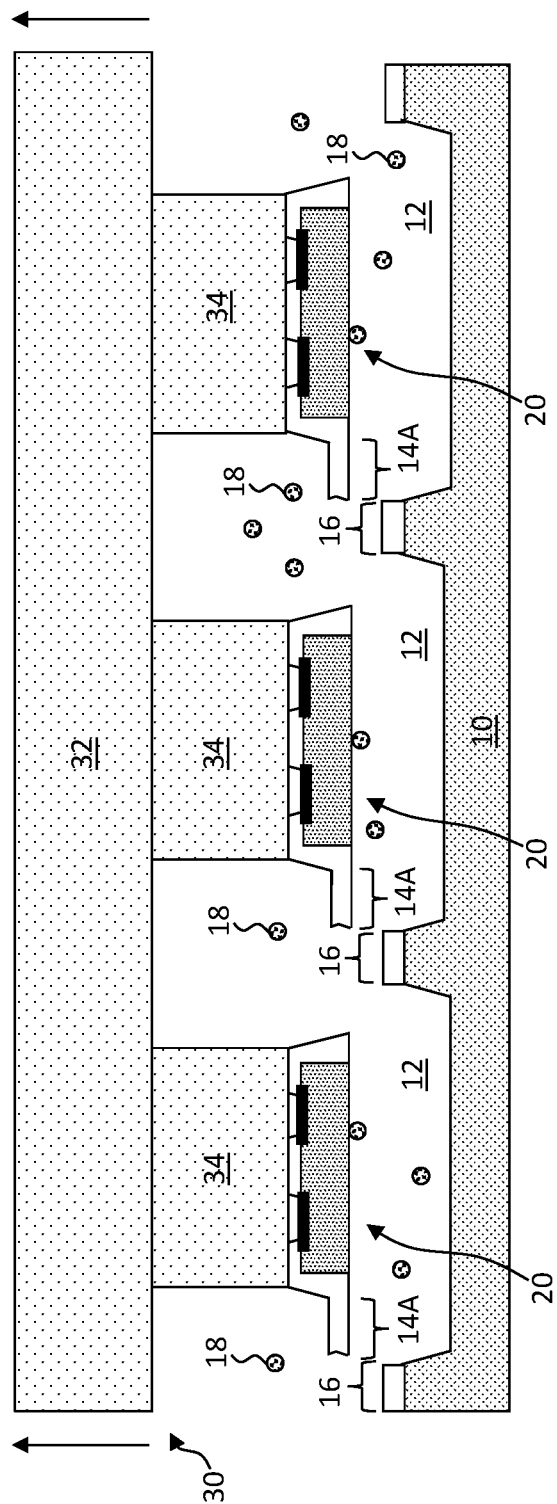
FIG. 7 is a cross section of a stamp, component, and source substrate with fractured tethers and contaminating particles useful in understanding embodiments of the present disclosure.

Referring to FIGS. 1A and 7, in some embodiments of transfer printing according to the present disclosure, components 20 are released from a source substrate 10 by undercutting components 20, for example by etching a sacrificial portion 12 of source substrate 10 on or over which components 20 are formed or otherwise disposed to form a space (e.g., a gap 12), such that components 20 are attached by a tether 14 to an anchor 16 of source substrate 10. (One or more tethers 14 can be used, for example in combination with one or more anchors 16.) Sacrificial portions 12 disposed in an array over source substrate 10 can be disposed in, on, or over source substrate 10 and, moreover, such sacrificial portions 12 can be designated portions of the source substrate 10 itself (e.g., an anisotropically etchable source substrate 10).

When components 20 are removed from source substrate 10 by a stamp 30, tethers 14 attaching each component 20 to an anchor 16 are broken (e.g., fractured) or separated from anchor 16, forming fractured or separated tethers 14A (shown in FIG. 7). According to some embodiments, the process of breaking (e.g., fracturing) tethers 14 or separating tethers 14 from anchors 16 can create particles 18 that contaminate stamp 30, components 20, source substrate 10, or a target substrate (not shown in FIGS. 1A and 7). The particle contamination can inhibit picking up components 20 from source substrate 10 or inhibit printing picked-up components 20 on stamp 30 to the target substrate. For example, particle contamination can cause misplacement, misalignment, or misconnection (e.g., electrical misconnection). Particle contamination can also inhibit the subsequent transfer of components 20 from source substrate 10 to a target substrate, thereby causing transfer failures and reducing transfer yields for transfer-printing operations.

Figure 8:
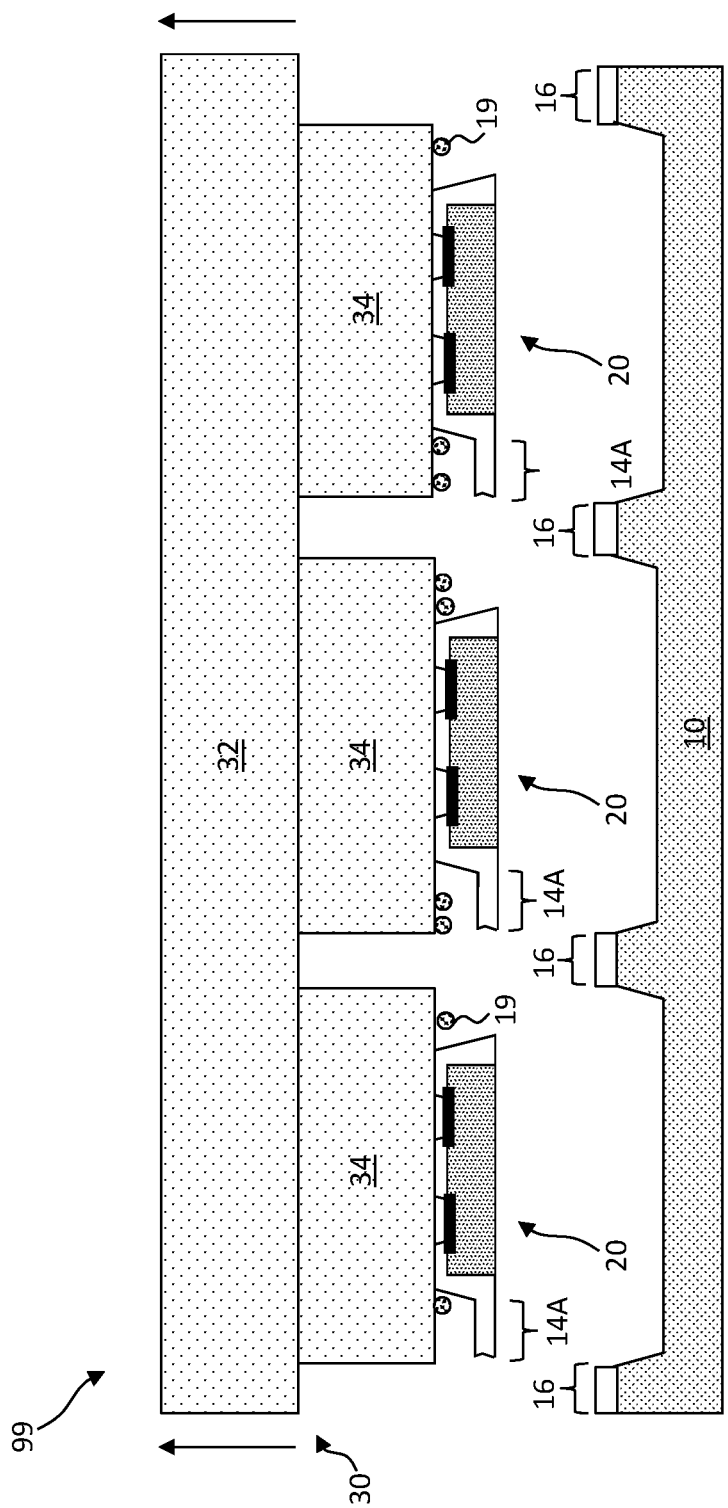
FIG. 8 is a cross section of a stamp, component, and source substrate with fractured tethers and captured particles according to illustrative embodiments of the present disclosure.

According to some embodiments of the present disclosure and as illustrated in FIG. 8, transfer yields can be improved by capturing at least some particles 18 with an enlarged stamp 30 with a greater extent (e.g., area) over substrate surface 11 of source substrate 10. Such a greater extent can cause contaminating particles 18 to adhere to enlarged portions of stamp 30 (thereby becoming captured particles 19). After one or more print operations with stamp 30, stamp 30 can be cleaned to remove captured particles 19 from stamp 30. Thus, in some embodiments, captured particles 19 may be allowed to be build up near a periphery of a contact surface of posts 34 to reduce time spent cleaning stamp 30 while still improving printing yields through particle capture 19.

Figure 1B:
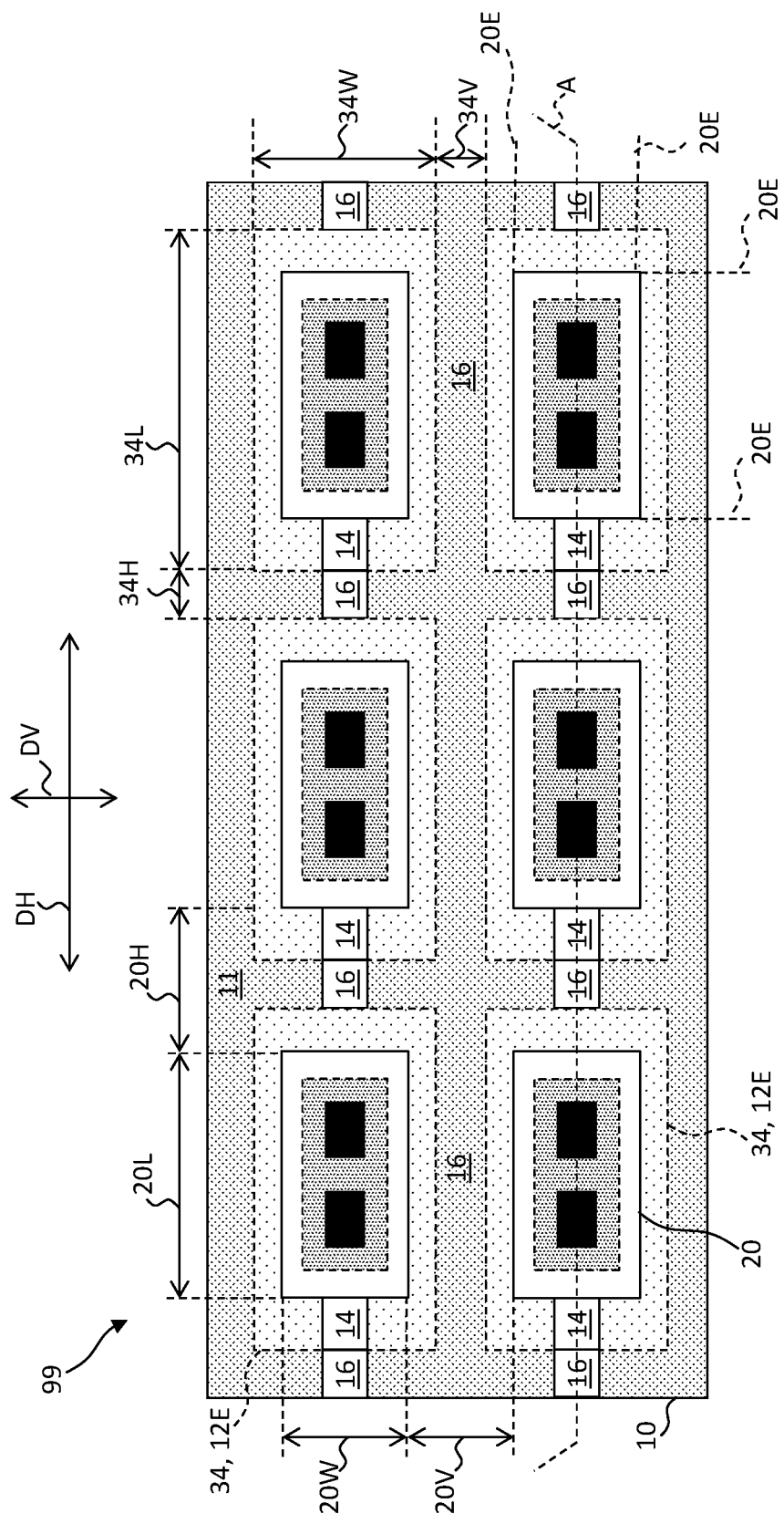
Figure 1C:
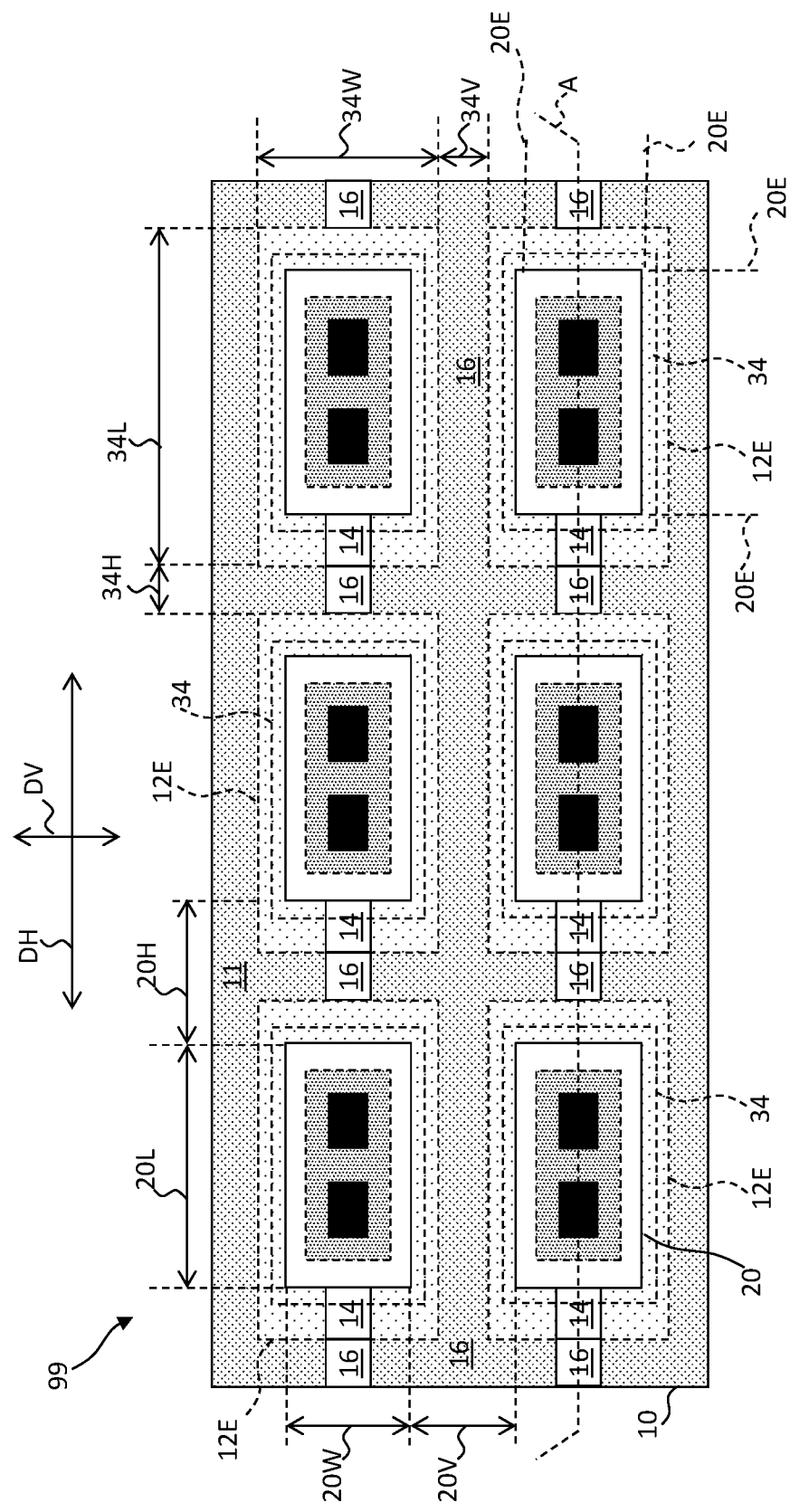
FIG. 1C is a plan view of a system having stamp areas and sacrificial areas of different sizes according to illustrative embodiments of the present disclosure.

Therefore, according to some illustrative embodiments of the present disclosure and referring again to the cross section of FIG. 1A and the corresponding plan views of FIGS. 1B and 1C, a micro-transfer printing system 99 comprises a source substrate 10 having a substrate surface 11 and components 20 disposed in an array on, over, or in the substrate surface 11 of source substrate 10. Each component 20 has a component extent (e.g., area) in a plane parallel to substrate surface 11, for example a component length 20L of component 20 times a component width 20W of component 20 (shown in FIGS. 1B and 1C). The component extent (e.g., area) can include all of the elements or components of component 20 (e.g., semiconductor materials, metal layers, electrical conductors, optical conductors, vias, contact pads, and dielectric structures) but does not include tether 14 or anchor 16.

An example of a stamp 30 comprises a stamp body 32 and stamp posts 34 extending away from stamp body 32 disposed in an array over stamp body 32. Stamp body 32 can comprise the same material as stamp post 34 and can be made in a common molding step. During a print operation, each stamp post 34 has a post location corresponding to and aligned with a component location of a component 20 on source substrate 10 so that stamp posts 34 can each contact a component 20 when stamp 30 is moved towards source substrate 10. A post surface of a distal post end 34D of each stamp post 34 has a post surface extent (e.g., area). The post surface extent of stamp post 34 can be over and substantially parallel to substrate surface 11 of source substrate 10. As shown in FIGS. 1B and 1C, the post surface extent can be a post length 34L of stamp post 34 times a post width 34W of stamp post 34, for example if the post surface is a flat rectangular surface. Distal post end 34D of stamp post 34 is opposite and remote from a proximal post end 34P of stamp post 34 and proximal post end 34P is in contact with or adjacent to stamp body 32. Note that, as used herein, post length 34L is not the distance between the proximal post end 34P and distal post end 34D (e.g., a height of stamp post 34).

Components 20 are separated in a horizontal direction DH by horizontal component separation distance 20H and separated in a vertical direction DV orthogonal to horizontal direction DH by vertical component separation distance 20V. Similarly, stamp posts 34 are separated in horizontal direction DH by horizontal post separation distance 34H and separated in vertical direction DV orthogonal to horizontal direction DH by vertical post separation distance 34V. Either or both of horizontal and vertical component separation distance 20H, 20V are a component separation distance and can be the smallest separation distance between adjacent components 20. Adjacent components 20 are nearest-neighbor (e.g., adjoining or adjacent) components 20 between which there are no other components 20 in a corresponding direction (e.g., a horizontal or vertical direction). Likewise, either or both of horizontal and vertical post separation distance 34H, 34V are a post separation distance and can be the smallest separation distance between adjacent stamp posts 34. Adjacent stamp posts 34 are nearest-neighbor stamp posts 34 between which there are no other stamp posts 34 in a corresponding direction (e.g., a horizontal or vertical direction). A post surface extent of distal post end 34D of stamp post 34 can be greater than a component extent and a post separation distance can be less than a component separation distance in either or both of horizontal and vertical directions DH, DV. (As will be understood by those knowledgeable in the art, 'horizontal' and 'vertical' are arbitrary designations and can be interchanged.) Thus, portions of a distal end of stamp posts 34 can be exposed (for example over gap 12) and are not in contact with components 20 or substrate surface 11. Exposed portions of stamp post 34 can be contacted by particles 18 when tethers 14 break (e.g., fracture) or separate and particles 18 adhere or stick to the exposed stamp post 34 portion thereby becoming captured particles 19, so that the captured particles 19 do not contaminate other portions of, for example, stamp 30, components 20, substrate surface 11, or target substrates.

Referring also to the more detailed illustration of components 20 in the cross section of FIG. 2A taken along cross section line A of the plan view of FIG. 2B, each component 20 can comprise a semiconductor structure 22 (for example comprising one or more of a circuit, electrical conductors, patterned metal layers, dielectric layers, vias, etc., such as are found in integrated circuits) and electrical contact pads 24 that can connect electrodes (not shown) to any circuit formed in semiconductor structure 22. Patterned dielectric layers, structures, or encapsulants 26 can electrically insulate semiconductor structure 22 and contact pads 24. Dielectric encapsulant 26 can form tethers 14 or anchor 16, or a portion of tethers 14 and anchor 16. In some embodiments, tether 14 or anchors 16 can instead or in addition comprise portions of semiconductor structure 22 or source substrate 10, for example semiconductor materials.

As shown in FIGS. 1A-1C, each component 20 can be disposed completely over a different corresponding sacrificial portion 12 (comprising a gap 12 when sacrificial portions 12 are etched) of source substrate 10 so that no portion of a component 20 extends beyond the corresponding sacrificial portion 12 in a direction parallel to substrate surface 11. Thus, component edges 20E defining edges of component 20 demarcating the component extent are within (or congruent with) a sacrificial portion 12 area demarcated by sacrificial portion edges 12E. The distance between component edges 20E in the horizontal direction define component length 20L and the distance between component edges 20E in the vertical direction define component width 20W (or vice versa). Referring to FIGS. 1A and 1B, in some embodiments of the present disclosure, stamp post 34 is aligned with and has a post surface extent similar to or the same as an extent (e.g., area) of sacrificial portion 12. Referring to FIG. 1C, in some embodiments of the present disclosure, stamp post 34 has a post surface extent less than an extent (e.g., area) of sacrificial portion 12 but greater than the component extent.

Thus, according to some embodiments of the present disclosure, a post surface extent is greater than or equal to 105% of a component extent (e.g., greater than or equal to 110%, greater than or equal to 120%, greater than or equal to 150%, or greater than or equal to 200% of the component extent). Similarly, according to some embodiments of the present disclosure, a post surface extent is equal to or less than 100% of a sacrificial portion extent (e.g., equal to or less than 90%, equal to or less than 80%, equal to or less than 70%, equal to or less than 60%, equal to or less than 50%, equal to or less than 40%, equal to or less than 30%, or equal to or less than 20% of the sacrificial portion extent). According to some embodiments of the present disclosure, stamp post 34 extends at least one quarter of the way from a component edge 20E to a sacrificial portion edge 12E above which component 20 is disposed (e.g., at least one half of the way from component edge 20E to sacrificial portion edge 12E, or at least three quarters of the way from component edge 20E to sacrificial portion edge 12E of sacrificial portion 12 above which component 20 is disposed).

In some embodiments, and as shown in FIGS. 1A-1C, a post surface extent is equal to (as shown in FIGS. 1A, 1B) or less than (as shown in FIG. 1C) a sacrificial portion extent. In some embodiments of the present disclosure, the post surface extent is greater than the sacrificial portion extent. Although it is possible in some such cases that in transfer printing a component 20 from source substrate 10 stamp post 34 can contact anchors 16, such embodiments can have the advantage of completely covering sacrificial portions 12 even in the event of at least a partial misalignment between stamp posts 34 and components 20, so that particles 18 can be effectively trapped and captured by stamp 30 thereby becoming captured particles 19. For example, edges of stamp post 34 can extend at least 500 nm (e.g., at least one micron, two microns, five microns, ten microns, twenty microns, fifty microns, or 100 microns) beyond sacrificial portion edges 12E in any one or more direction(s) substantially parallel to substrate surface 11. Stamp post surface of stamp posts 34 can have a similar shape to an extent of component 20 (e.g., both being rectangular) or a different shape (e.g., one being rectangular and the other being circular).

Figure 3A:
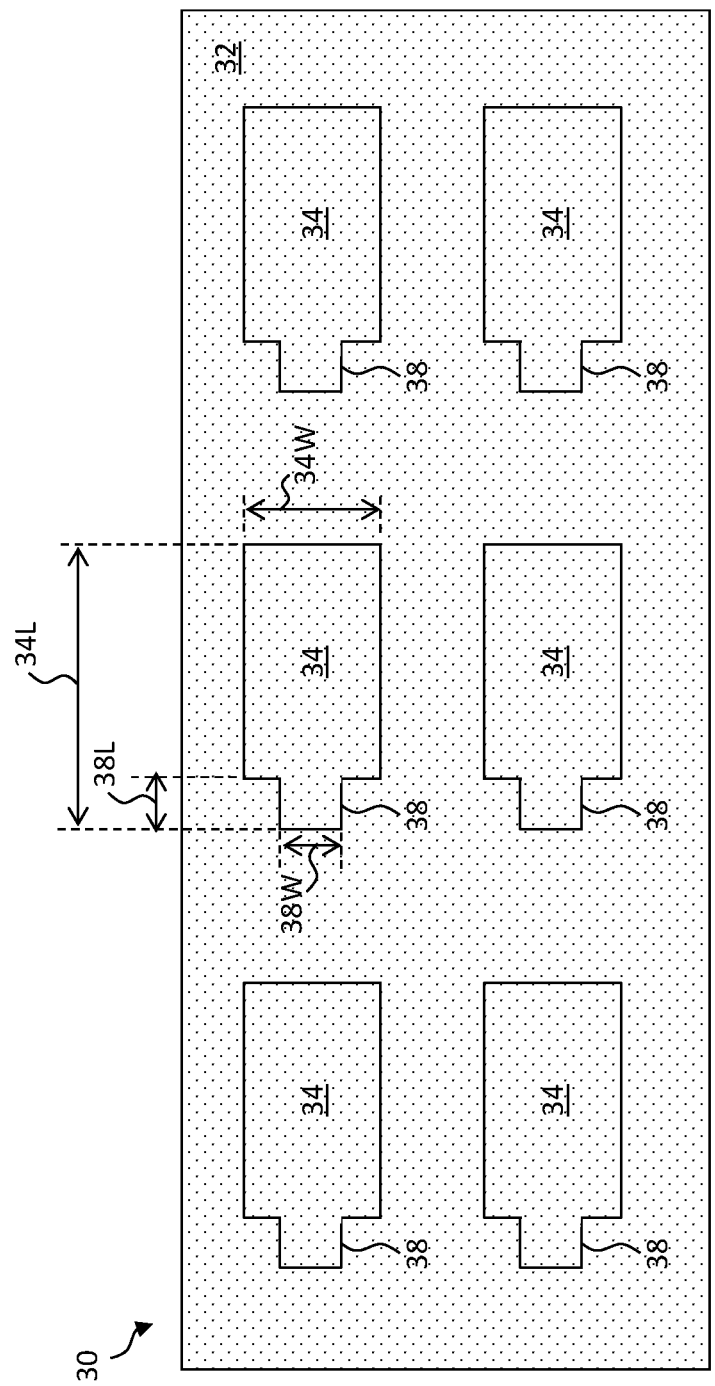
FIG. 3A is a plan view of a stamp according to illustrative embodiments of the present disclosure.
Figure 3B:
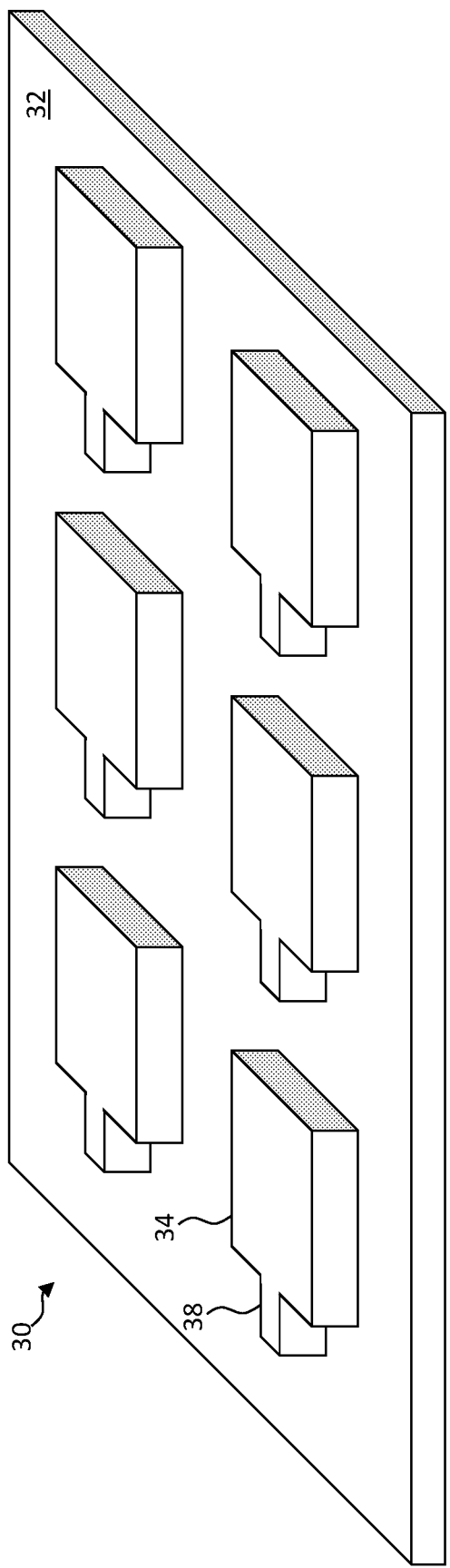
FIG. 3B is a perspective of a stamp corresponding to FIG. 3A according to illustrative embodiments of the present disclosure.

In some embodiments of the present disclosure, stamp posts 34 as shown in FIGS. 1A-1C have a rectangular cross section parallel to substrate surface 11. In some embodiments, stamp posts 34 have a non-rectangular cross section parallel to substrate surface 11, for example a polygonal, circular, oval, elliptical shape, or a shape whose perimeter comprises straight or curved line segments at any angle and of any number. Referring to FIGS. 3A-3D, in some embodiments of the present disclosure, distal post ends 34D of stamp posts 34 comprise a portion (e.g., a rectangular portion) that extends primarily over component 20 (or other substantial portion of any shape that extends primarily over component 20) and a lateral post protrusion 38 that protrudes (e.g., extends) from the rectangular portion in a direction parallel to substrate surface 11, for example at least partially over tether 14. FIG. 3A is a bottom view and FIG. 3B is a perspective of a stamp 30 with a two-by-three array of stamp posts 34, each having a lateral post protrusion 38. Lateral post protrusion 38 can, but does not necessarily, have a rectangular shape, and can have a width 38W that is less than a post width 34W of stamp post 34 or a length 38L that is less than a post length 34L of stamp post 34, or both, as shown in FIGS. 3A and 3B. Lateral post protrusion 38 can have a length-to-width aspect ratio of, for example, at least 0.5, 1.0, 1.5, or 2.0 and can have a size and shape selected for capturing particles 18 (e.g., based on particular tethers 14 with which stamp 30 is designed to be used).

Figure 3C:
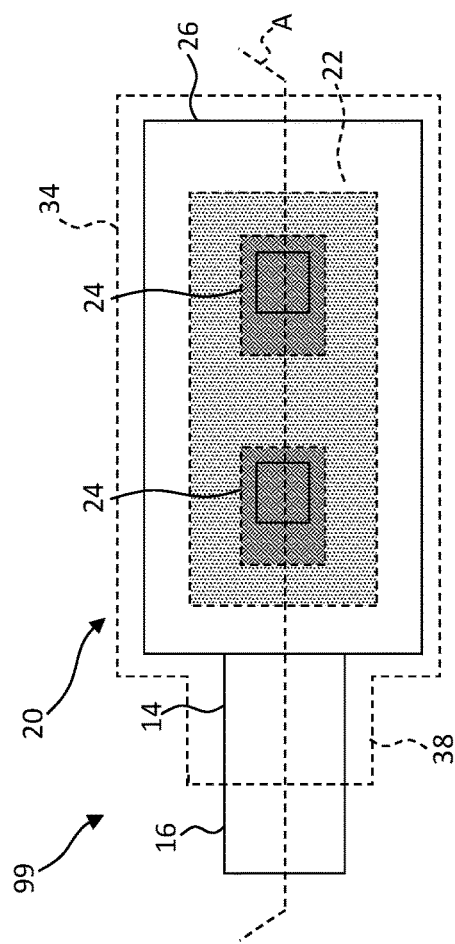
FIGS. 3C-3E are plan views of stamps with a stamp post protrusion over a component structure according to illustrative embodiments of the present disclosure.
Figure 3D:
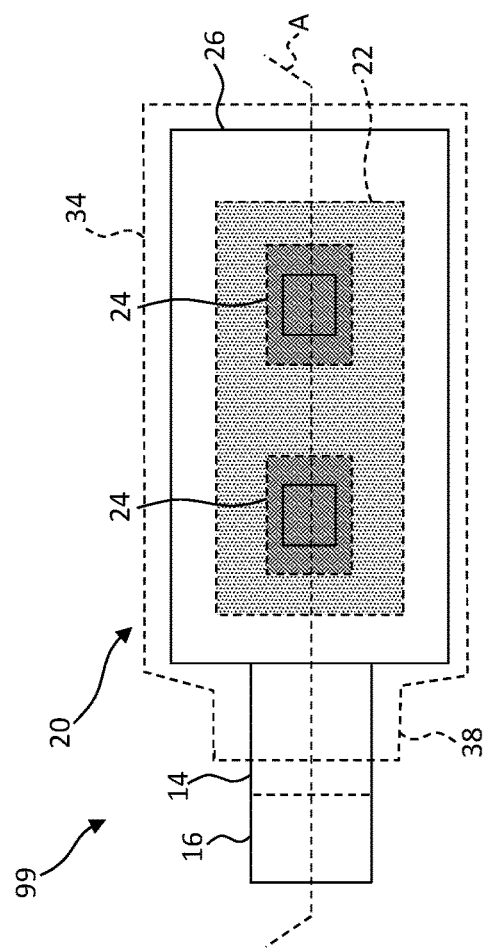
Figure 3E:
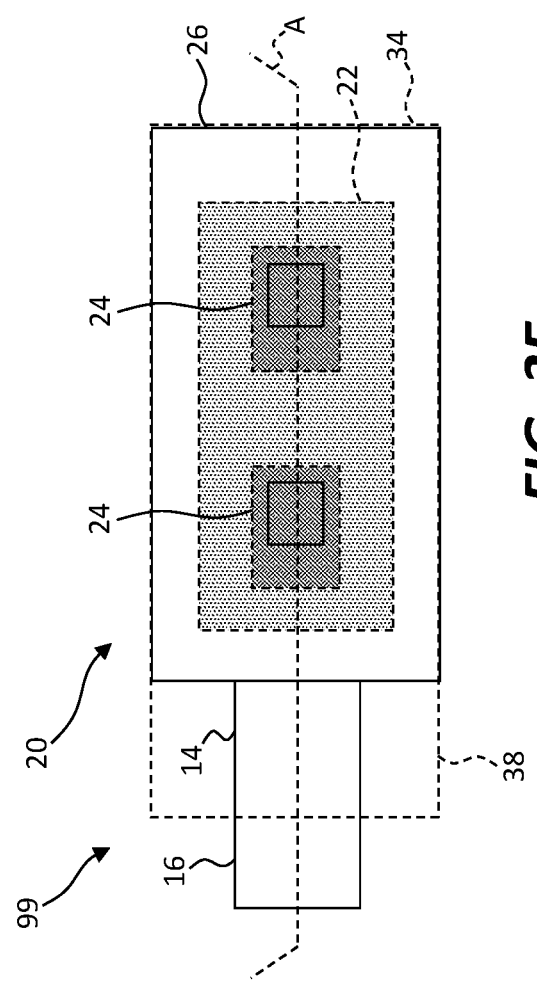

FIG. 3C illustrates stamp post 34 in accordance with FIGS. 3A and 3B in alignment with component 20. Lateral post protrusion 38 is aligned with tether 14 so that lateral post protrusion 38 is disposed over tether 14 when stamp post 34 contacts component 20 and fractures tether 14. By disposing lateral post protrusion 38 over tether 14 when tether 14 is broken (e.g., fractured) or separated, particles 18 that are formed by the breaking or separating can adhere to lateral post protrusion 38 or to other portions of the distal end of stamp post 34. Stamp post 34 can extend over the sides (e.g., component edges 20E) of component 20 on any one or more of the sides, including over the sides of lateral post protrusion 38, as shown in FIGS. 3C and 3D. FIG. 3C illustrates lateral post protrusion 38 extending over the entire tether 14 up to anchor 16; in some embodiments, such as that of FIG. 3D, lateral post protrusion 38 extends over only a portion of tether 14. In FIG. 3E, lateral post protrusion 38 extends entirely over tether 14 and lateral post protrusion 38 has a width equal to that of component 20. In some embodiments, and as shown in FIG. 3E, stamp post 34 has a width equal to that of component 20, does not extend beyond component 20 on a non-tether end of component 20, and extends entirely over tether 14. Some embodiments according to FIG. 3E can have the advantage of providing a particle 18 trapping surface of stamp post 34 near to tether 14 without affecting portions of component 20 or stamp post 34 remote from tether 14. A cross section corresponding to cross section line A of FIGS. 3C-3E is illustrated in the component 20 cross section of FIG. 2A and (including stamp 30) in the cross section of FIG. 1A.

According to some embodiments of the present disclosure, adjacent structures are structures between which no other structure is disposed, or no other structure is closer to both the adjacent structures. As is the case for the terms 'horizontal' and 'vertical', the terms 'length' and 'width' are generally arbitrary and can be exchanged, although 'length' often refers to the longer of the two dimensions of a surface or structure in comparison to 'width.' In any case, the appellations "length' and 'width' can be exchanged and do not limit the particular embodiments of the present disclosure that they describe.

Figure 4A:
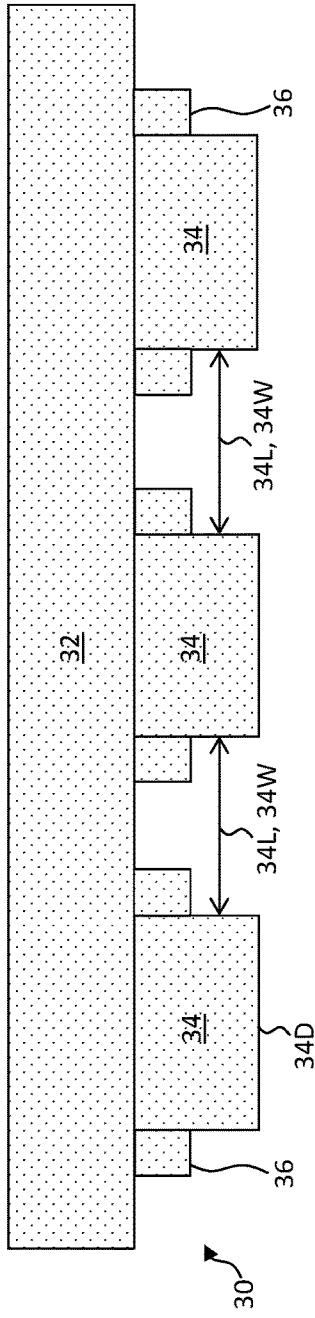
FIG. 4A is a cross section of a stamp with a step according to illustrative embodiments of the present disclosure.
Figure 4B:
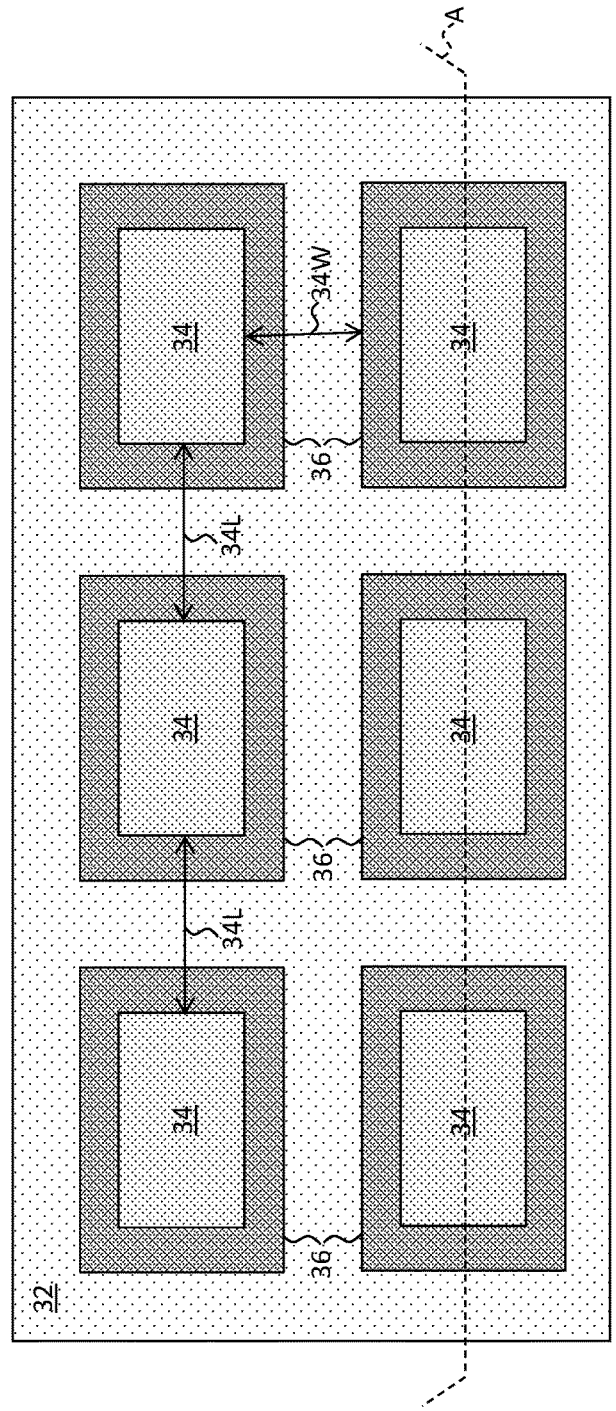
FIG. 4B is a bottom view of the stamp with the step of FIG. 4A according to illustrative embodiments of the present disclosure.
Figure 5:
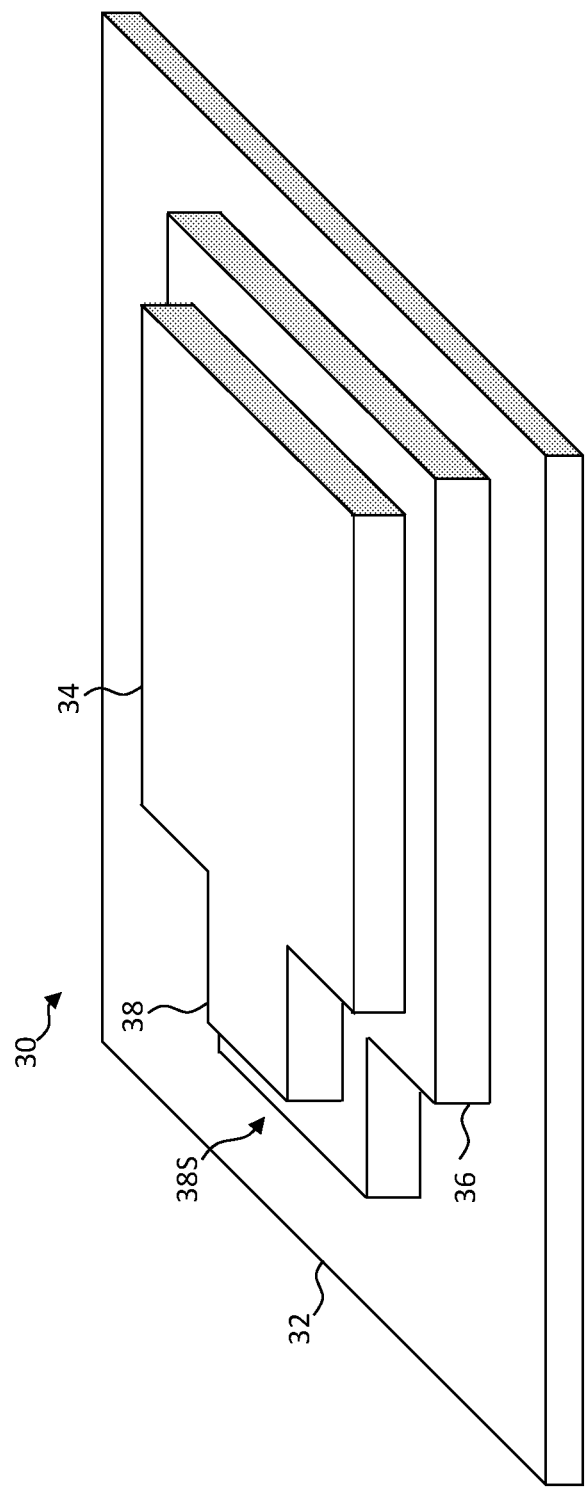
FIG. 5 is a perspective of a stamp with a stamp post step and a stamp post protrusion according to illustrative embodiments of the present disclosure.

In some embodiments of the present disclosure, stamp posts 34 extend over at least a portion of anchors 16 of source substrate 10 and can contact anchors 16 when picking up components 20 with stamp 30. In some embodiments, stamp posts 34 extend over but do not contact anchors 16. Note that anchors 16 can refer to portions of source substrate 10 that are not sacrificed (are not sacrificial portion 12) and can therefore surround sacrificial portion 12, as shown in FIGS. 1B-1C. Referring to FIGS. 4A, 4B, and 5, stamp posts 34 comprise a step 36 that extends from stamp body 32 only part of the way to distal post end 34D. Step 36 can be formed in a common molding step as post 34, after post 34 is formed, or as part of a two-step process in which a mesa is formed and then a second portion of post 34 is formed thereon. As shown in FIG. 4B and FIG. 5, step 36 can surround the distal post end 34D of stamp post 34. Because step 36 is shorter than stamp post 34 it does not necessarily contact anchor 16 when distal post end 34D contacts components 20 but can capture particles 18, thereby reducing particulate contamination in the system (e.g., more effectively than stamp body 32 can). In some embodiments, step 36 can comprise a step lateral post protrusion 38S. Step 36 can have a height that is no more than ten microns (e.g., no more than one micron, two microns, or five microns) less than a height of stamp post 34. Step 36 can have a height that is no less than 50% (e.g., no less than 90%, 80%, 70%, or 60%) of the height of stamp post 34. Step 36 can extend greater than or equal to one micron (e.g., greater than or equal to two microns, five microns, ten microns, 20 microns, 50 microns, 100 microns, or 250 microns) beyond stamp post 34 in a direction parallel to substrate surface 11. Step 36 can have an extent (e.g., area) at least 110% (e.g., at least 120%, 150% or 200%) of a post surface extent.

Figure 6:
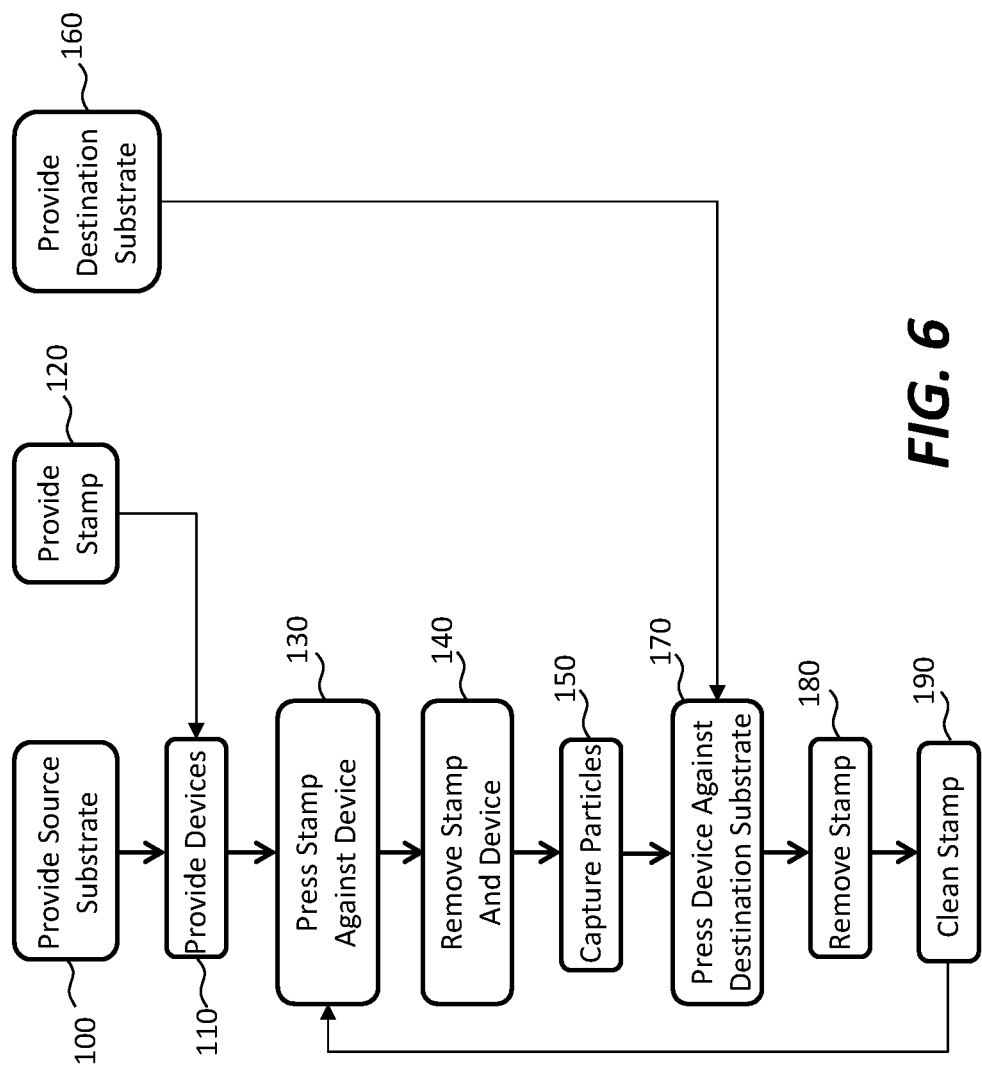
FIG. 6 is a flow diagram illustrating methods in accordance with embodiments of the present disclosure.

According to some embodiments of the present disclosure and as illustrated in FIG. 6, a method of micro-transfer printing comprises providing a source substrate 10 comprising sacrificial portions 12 disposed in an array over source substrate 10 in step 100. Sacrificial portions 12 can be laterally separated by anchors 16. A component 20 is disposed directly on or over each sacrificial portion 12 and is physically connected to an anchor 16 with a tether 14 in step 110. Each component 20 has a component extent and is spaced apart from an adjacent component 20 by a component separation distance (e.g., a horizontal component separation distance 20H or a vertical component separation distance 20V). In step 120, a stamp 30 comprising a stamp body 32 and stamp posts 34 extending away from the stamp body 32 disposed in an array over stamp body 32 is provided. Each stamp post 34 has a post location corresponding to a component location of a component 20 and a post surface of a distal post end 34D having a post surface extent on a distal post end 34D of stamp post 34. The post surface extent is greater than the component extent. Each stamp post 34 is pressed against a corresponding component 20 in step 130 to adhere the corresponding component 20 to the stamp post 34. In step 140, stamp 30 is removed from source substrate 10, thereby breaking (e.g., fracturing) or separating tethers 14 and making particles 18 that, in step 150, adhere to stamp 30, for example at stamp post 34.

Figure 9A:
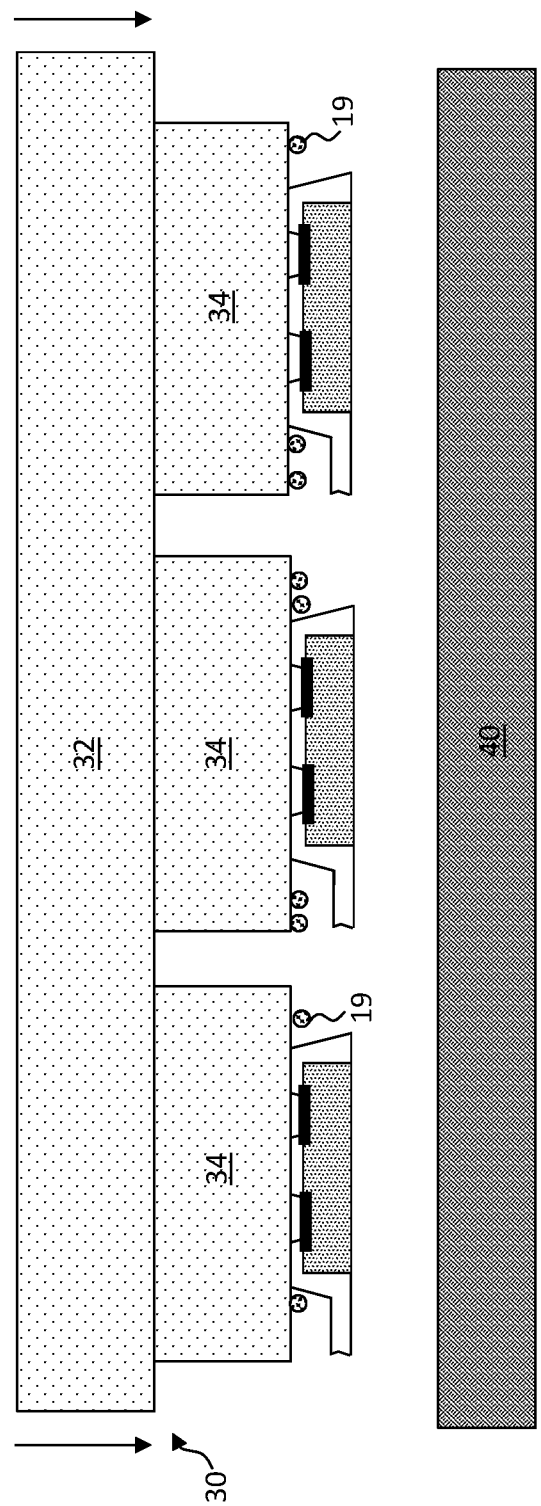
FIG. 9A-9C are sequential cross sections of a stamp, component, and destination substrate with fractured tethers and captured particles according to illustrative embodiments of the present disclosure.
Figure 9B:
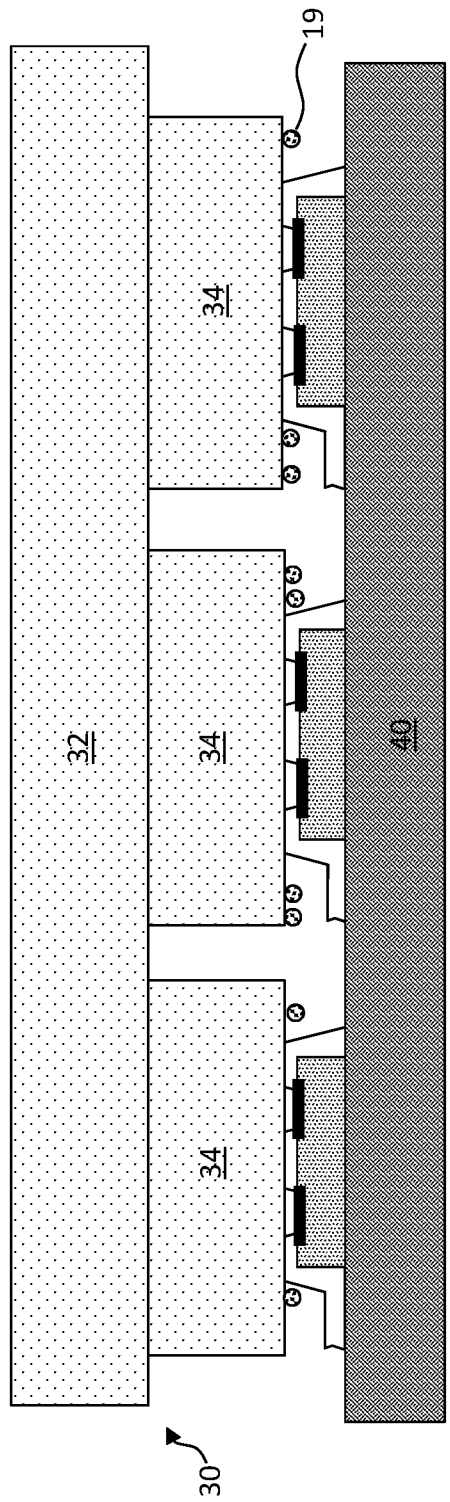
Figure 9C:
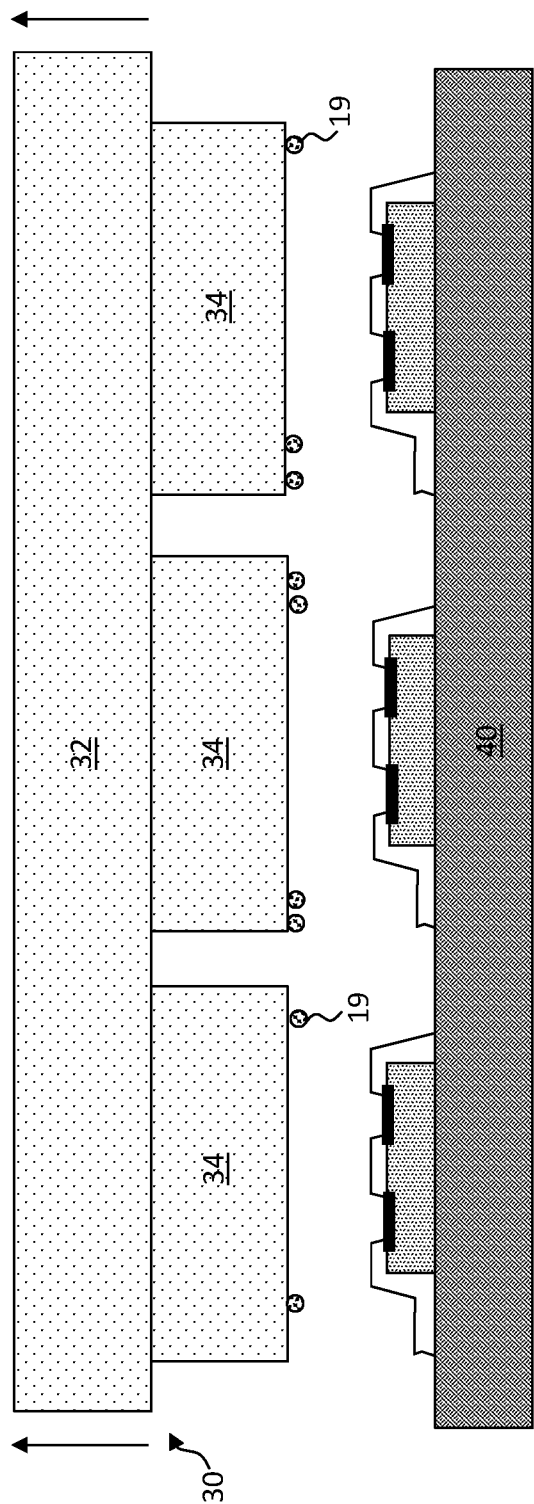
Figure 10A:
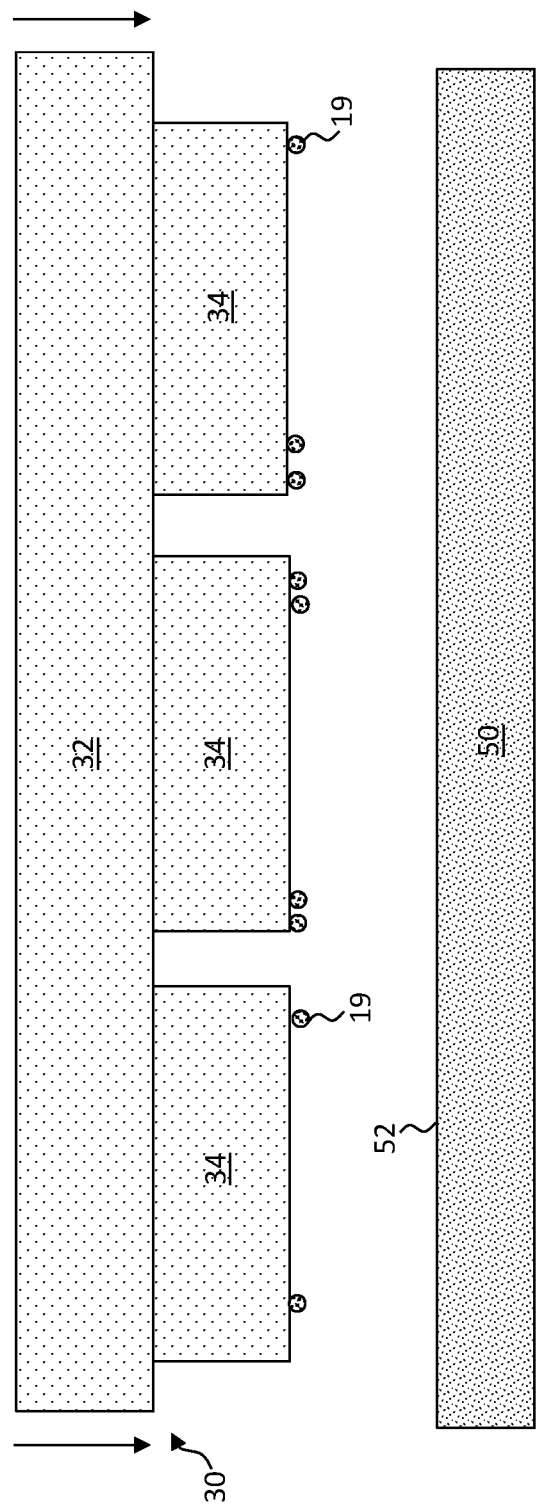
FIGS. 10A-10C are sequential cross sections of a cleaning surface and stamp with captured particles according to illustrative embodiments of the present disclosure.
Figure 10B:
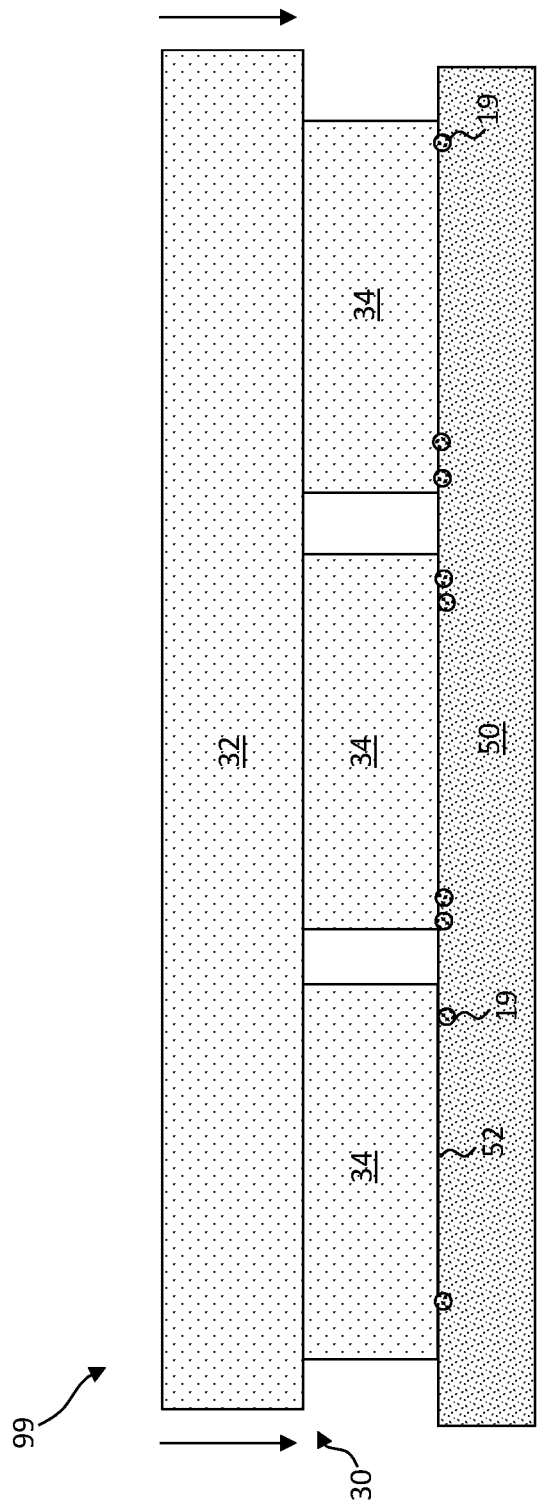
Figure 10C:
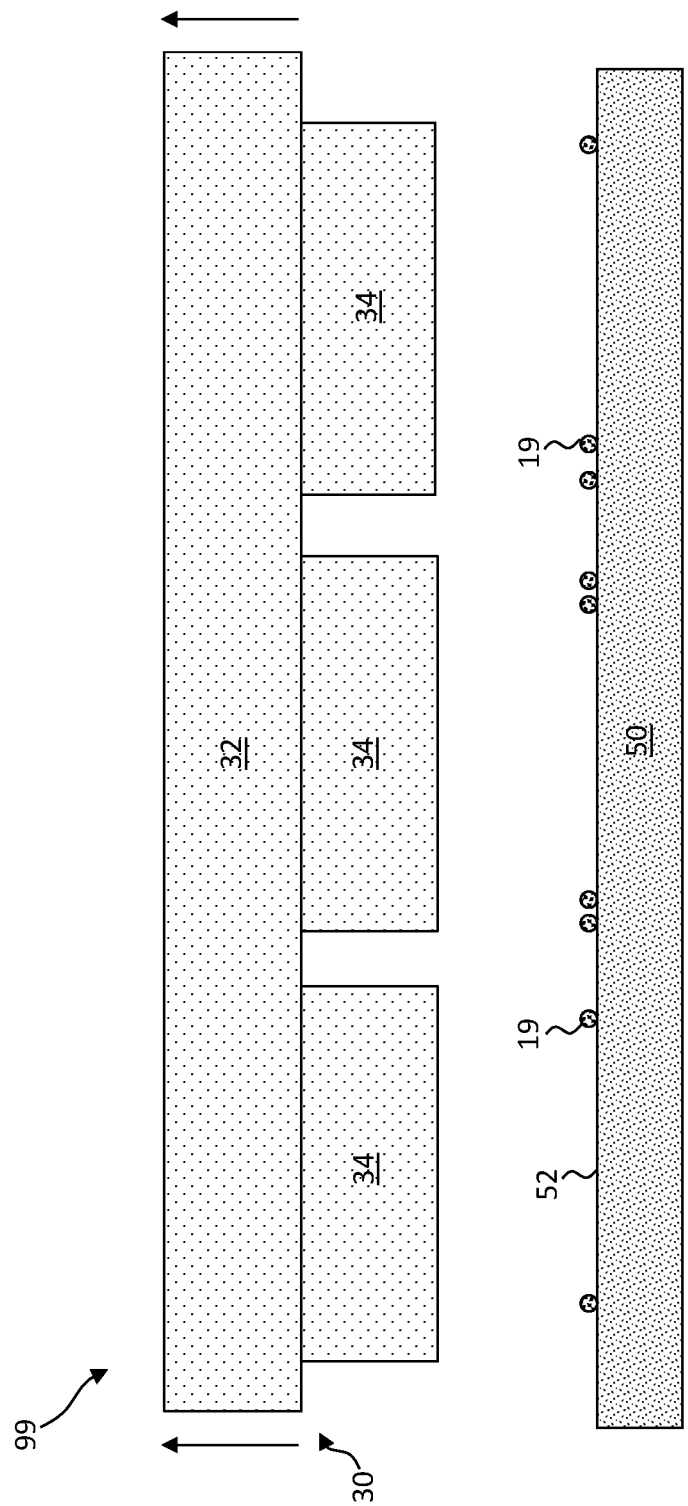

In some embodiments of the present disclosure and as also illustrated in FIGS. 9A-9C, a target (e.g., destination) substrate 40 is provided in step 160. Stamp 30 with adhered components 20 are transferred to target substrate 40 (as shown in FIG. 9A) and components 20 are pressed to target substrate 40 with stamp 30 in step 170 (as shown in FIG. 9B) to adhere components 20 to target substrate 40 while captured particles 19 remain adhered to stamp 30 and stamp 30 is removed in step 180 (as shown in FIG. 9C). Referring to FIGS. 10A-10C, stamp 30 is transported to a cleaning surface 52 of a cleaning substrate 50 (e.g., an adhesive tape), as shown in FIG. 10A. In step 190 and as shown in FIG. 10B, stamp 30 is cleaned to remove captured particle 19 from stamp 30, for example by pressing stamp posts 34 against a cleaning surface 52 of a cleaning substrate 50. (As other examples, stamp posts 34 could be cleaned with a fluid or plasma.) Cleaned stamp 30 is then removed, leaving captured particles 19 adhered to cleaning substrate 50, as shown in FIG. 10C. In subsequent cleaning steps, different portions of cleaning surface 52 of cleaning substrate 50 can be used to clean stamp 30 to avoid contacting captured particles 19 on cleaning surface 52 to stamp posts 34. Stamp posts 34 with steps 36 can be cleaned, for example, in an ultrasonic bath.

The method illustrated in FIG. 6 can be repeated by iteratively pressing stamp 30 against different components 20 on source substrate 10 in step 130 and transferring them to target substrate 40 in step 170. For example, stamp 30 can be shifted relative to unprinted components 20 on source substrate 10 by a component separation distance between printings. Stamp 30 can be cleaned in step 190 after every transfer, as shown in FIG. 6, or after more than one print step (not shown in FIG. 6).

According to some embodiments of the present disclosure, a stamp 30 for transfer printing (e.g., micro-transfer printing) comprises a stamp body 32 and stamp posts 34 extending away from stamp body 32 disposed in an array over stamp body 32. Each stamp post 34 has a non-rectangular distal end (for example as shown in FIGS. 3A-3D and FIG. 5) or a step 36 distal end (for example as shown in FIGS. 4A, 4B and 5). In some embodiments, step 36 surrounds the distal end of each stamp post 34 so that the step extends laterally beyond each edge of the post surface 34D, as shown in FIGS. 4B and 5. In some embodiments, the distal end of each stamp post 34 has a post length 34L and a post width 34W and comprises a lateral post protrusion 38 in a direction of post length 34L having a post protrusion width 38W less than the post width 34W.

Such printed structures enable low-cost, high-performance arrays of electrically connected components such as integrated circuits or micro-light-emitting diodes (micro-LEDs) useful, for example, in display systems. For example, components 20 can be micro-assembled arrays of micro-components, such as integrated circuits or micro-LEDs, that are too small (e.g., with at least one of a width, length, height, and diameter of 0.5 µm to 50 µm such as a width of 1-8 µm, a length of 5-10 µm or a height of 0.5-3 µm), numerous, or fragile to be assembled by conventional means. Rather, these arrays are assembled using transfer-printing technology (e.g., micro-transfer-printing technology).

Components 20 may be prepared on a native source substrate 10 and printed to a target (destination) substrate 40 (e.g., plastic, metal, glass, ceramic, sapphire, transparent materials, opaque materials, rigid materials, or flexible materials), thereby obviating the manufacture of components 20 on target substrate 40. Components 20 (e.g., micro-components or chiplets) can be small integrated circuits, can be unpackaged dies released from a source substrate 10, and can be micro-transfer printed. Components 20 can have, for example, one or more of a width from 1-8 µm, a length from 5-10 µm, and a height from 0.5-3 µm. Transfer-printable components 20 can have at least one of a width, length, and height from 2 to 1000 µm (e.g., 2 to 5 µm, 5 to 10 µm, 10 to 20 µm, 20 to 50 µm, 50 µm to 100 µm, 100 µm to 250 µm, 250 µm to 500 µm, or 500 µm to 1000 µm). Components 20 can have a doped or undoped semiconductor substrate, for example having a thickness of 2 to 50 µm (e.g., 2 to 5 µm, 5 to 10 µm, 10 to 20 µm, or 20 to 50 µm). Components 20 can be integrated circuits with a length greater than width, for example having an aspect ratio greater than or equal to 2 (e.g., greater than or equal to 4, 8, 10, 20, or 50) and, optionally, component contact pads 24 that are adjacent to the ends of transfer-printable components 20 along the length of the transfer-printable components 20. In some embodiments, components 20 are electrically connected to target substrate 40 using connection posts (not shown). Examples of connection posts are described in U.S. patent application Ser. No. 14/822,864 and U.S. Pat. No. 10,262,966, the disclosures of which are each hereby incorporated by reference in its entirety.

A micro-transfer printable component 20 can be an active electrical component, for example including one or more active elements such as electronic transistors or diodes. Transfer-printable components 20 can be electronic processors, controllers, drivers, light-emitters, sensors, light-control components, or light-management components. Transfer-printable components 20 can be integrated circuits, for example CMOS integrated circuits made on or in a silicon semiconductor source substrate 10 (a wafer), light-emitting diodes (LEDs) or lasers, for example made on or in a GaN semiconductor source substrate 10 (a wafer), or silicon photodiodes. Alternatively, transfer printable component 20 can be a passive component, for example including one or more passive elements such as resistors, capacitors, or conductors such as electrical jumpers. In some embodiments, transfer printable component 20 is a compound micro-transfer printable component 20 that includes both active and passive elements. Transfer-printable component 20 can be a semiconductor component 20 having one or more semiconductor layers, such as an integrated circuit or chiplet. Transfer-printable component 20 can be an unpackaged die. In some embodiments, transfer-printable component 20 is a compound element having a plurality of active or passive elements, such as multiple semiconductor components with separate substrates, each with one or more active elements or passive elements, or both. In certain embodiments, the plurality of elements is disposed and interconnected on a compound-element substrate separate from the substrates of any semiconductor components or a different substrate. The compound element can be transfer printed itself after the elements have been arranged and interconnected thereon.

Printable component structures can be made in a semiconductor source substrate 10 (e.g., a silicon or GaN wafer) having a process side and a back side used to handle and transport the wafer. Transfer-printable components 20 are formed using lithographic processes in an active layer on or in the process side of a source substrate 10. An empty release layer space (sacrificial portion 12) is formed beneath transfer-printable components 20 with tethers 14 connecting transfer-printable components 20 to anchors 16 on source substrate 10 in such a way that pressure applied against transfer-printable components 20 breaks tethers 14 to release transfer-printable components 20 from source substrate 10 (e.g., with stamp 30). Methods of forming such structures are described, for example, in U.S. Pat. No. 8,889,485. Lithographic processes for forming transfer-printable components 20 in source substrate 10, for example transistors, wires, and capacitors, are found in the integrated circuit art.

According to some embodiments of the present disclosure, a source substrate 10 can be a source wafer, for example a semiconductor wafer such as a crystalline silicon or compound semiconductor wafer, or a glass, sapphire, quartz, or polymer substrate or any substrate material capable of supporting transfer-printable components 20. Source substrate 10 can have a diameter greater than or equal to 10 cm (e.g., greater than or equal to 15 cm, 20 cm, 25 cm, 30 cm, 40 cm) or even larger. Source substrate 10 can have opposing substantially parallel sides and components 20 can be disposed on one of the sides. Source substrate 10 can be thin for example having a thickness of less than one mm (e.g., less than or equal to 700 microns, 500 microns, or 100 microns), or can be relatively thicker, for example having a thickness of one mm or more (e.g., two mm or more, or five mm or more).

Micro-structured stamps 30 (e.g., elastomeric stamps, visco-elastic stamps, PDMS stamps, electrostatic stamps, or hybrid elastomeric/electrostatic stamps) can be used to pick up components 20, transport components 20 to target (destination) substrate 40, and print components 20 onto target substrate 40. In some embodiments, surface adhesion forces are used to control the selection and printing of components 20 onto target substrate 40. In some embodiments, other forces adhere components 20 to stamp 30 (e.g., in combination with adhesive forces), for example electro-static or magnetic forces. This process may be performed massively in parallel. Stamps 30 can be designed to transfer a single component 20 or hundreds to thousands of discrete components 20 in a single pick-up and print operation. For a discussion of embodiments of micro-transfer printing generally, see U.S. Pat. Nos. 7,622,367 and 8,506,867, each of which is hereby incorporated by reference in its entirety. Stamps 30 can be constructed by photolithographically defining a master mold against which liquid material (e.g., PDMS) is cast and solidified to form stamp 30. Stamp 30 is then removed from the master mold. Stamp 30 can have a rigid back to which stamp body 32 is adhered, for example a transparent rigid back comprising glass, on an opposite side of stamp body 32 from which stamp posts 34 extend.

The target (e.g., destination substrate 40 can be glass (for example a portion of a flat-panel display substrate), soda-lime glass, borosilicate glass, pyrex, metal, ceramic, polymer, or a semiconductor (for example a wafer or portion of a wafer). Target substrate 40 can have a thickness ranging from 0.5 mm to 10 mm. These ranges are illustrative and not limiting and other materials and sizes can be included or used.

According to various embodiments of the present disclosure, a native source substrate 10 can be provided with the transfer-printable component 20, sacrificial portions 12, and tethers 14 already formed, or they can be constructed as part of the process of the present disclosure.

Source substrate 10 and transfer-printable components 20, stamp 30, and target (destination) substrate 40 can be made separately and at different times or in different temporal orders or locations and provided in various process states.

In comparison to thin-film manufacturing methods, using densely populated source substrates 10 and transferring micro-transfer printable components 20 to a target substrate 40 that requires only a sparse array of micro-transfer printable components located thereon with a stamp 30 does not waste or require active layer material on a target substrate 40. The present disclosure can also be used in transferring transfer-printable components 20 made with crystalline semiconductor materials that have higher performance than thin-film active components. Furthermore, the flatness, smoothness, chemical stability, and heat stability requirements for a target substrate 40 used in some embodiments of the present disclosure may be reduced because the adhesion and transfer processes are not substantially limited by the material properties of target substrate 40. Manufacturing and material costs may be reduced because of high utilization rates of more expensive materials (e.g., source substrate 10) and reduced material and processing requirements for target substrate 40.

As is understood by those skilled in the art, the terms "over" and "under" are relative terms and can be interchanged in reference to different orientations of the layers, elements, and substrates included in the present disclosure.

For example, a first layer on a second layer, in some implementations means a first layer directly on and in contact with a second layer. In other implementations a first layer on a second layer includes a first layer and a second layer with another layer therebetween.

Having described certain implementations, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously.

PARTS LIST

A cross section line
DH horizontal direction
DV vertical direction
10 source substrate/source wafer
11 substrate surface
12 sacrificial portion/gap
12E sacrificial portion edge
14 tether
14A fractured tether
16 anchor
18 particle
19 captured particle
20 component
20E component edge
20H horizontal component separation distance
20L component length
20V vertical component separation distance
20W component width
22 semiconductor structure
24 contact pad
26 dielectric encapsulant
30 stamp
32 stamp body
34 stamp post
34D distal post end/post surface
34H horizontal post separation distance
34L post length
34P proximal post end
34V vertical post separation distance
34W post width
36 step
38 lateral post protrusion
38S step lateral post protrusion
38L protrusion length
38W protrusion width
40 destination substrate/target substrate
50 cleaning substrate
52 cleaning surface
99 micro-transfer printing system
100 provide source substrate step
110 provide component step
120 provide stamp step
130 press stamp against component step
140 remove stamp and component step
150 capture particles step
160 provide destination substrate step
170 press component against destination substrate step
180 remove stamp step
190 clean stamp step

What is claimed:

1. A stamp for micro-transfer printing, comprising:
a stamp body; and
stamp posts in contact with and extending away from the stamp body disposed in an array over the stamp body, wherein each of the stamp posts comprises a lateral post protrusion extending from only a portion of a side of the distal end of the stamp post,
wherein the stamp posts and the lateral post protrusion comprise an elastomer.

2. A stamp for micro-transfer printing, comprising:
a stamp body; and
stamp posts in contact with and extending away from the stamp body disposed in an array over the stamp body, wherein each of the stamp posts comprises a step that comprises a lateral post protrusion extending from only a portion of a side of a proximal end of the stamp post,
wherein the stamp posts and the lateral post protrusion comprise an elastomer, and
wherein the step extends only part of the way from the stamp body to a distal end of the stamp post end.

3. The stamp of claim 1, wherein the lateral post protrusion has a length-to-width aspect ratio of at least 0.5.

4. A method of micro-transfer printing, comprising:
providing a source substrate comprising sacrificial portions disposed in an array over the source substrate, the sacrificial portions laterally separated by anchors;
providing a component disposed directly on or over each of the sacrificial portions and physically connected to an anchor with a tether, each component having a component extent and spaced apart from a neighboring component by a component separation distance;
providing a stamp comprising a stamp body and elastomer stamp posts extending away from the stamp body disposed in an array over the stamp body, each of the stamp posts comprising a lateral post protrusion, each of the stamp posts having a post surface extent on a distal end of the stamp post greater than the component extent;
positioning the stamp to locate each stamp post in alignment with a corresponding component and pressing each of the stamp posts against the corresponding component to adhere the corresponding component to the stamp post; and
removing the stamp from the source substrate, thereby fracturing the tether physically connecting the corresponding component and making particles that subsequently adhere to the stamp.

5. The method of claim 4, comprising:
providing a destination substrate;
transferring the stamp and adhered components to the destination substrate;
pressing the components to the destination substrate with the stamp, to adhere the components to the destination substrate; and
removing the stamp.

6. The method of claim 4, comprising cleaning the stamp to remove the particles from the stamp after removing the stamp.

7. The method of claim 4, wherein at least a portion of the particles adhere to the distal end of the stamp post.

8. The method of claim 4, wherein the stamp post comprises a step and at least a portion of the particles adhere to the step.

9. A method of transfer printing a component, the method comprising:
providing a stamp comprising a stamp body and elastomer stamp posts extending away from the stamp body disposed in an array over the stamp body, each of the stamp posts comprising a lateral post protrusion, wherein at least one of the stamp posts has a post surface extent on a distal end of the stamp post;
providing a component disposed on a source substrate, wherein the component is physically connected to the source substrate by at least one tether and the component has a component extent that is smaller than the post surface extent; and
removing the component from the source substrate, wherein removing the component comprises contacting the component to the stamp post and breaking or separating the at least one tether thereby causing particles to form, and
wherein at least a portion of the particles adhere to the stamp post while the stamp post is in contact with the component.

10. The method of claim 9, wherein at least a portion of the particles adhere to the distal end of the stamp post while the stamp post is in contact with the component.

11. The method of claim 9, wherein the stamp post comprises a step and at least a portion of the particles adhere to the step while the stamp post is in contact with the component.

12. The method of claim 9, comprising:
transferring the component from the source substrate to a destination substrate;
pressing the component to the destination substrate; and
separating the stamp from the component, wherein at least a portion of the particles are made airborne as a result of the separation and subsequently adhere to the stamp post.

13. The method of claim 12, comprising cleaning the stamp to remove the at least a portion of the particles from the stamp after removing the stamp.

14. The method of claim 9, wherein a sacrificial portion is disposed between the component and the source substrate and the method comprises etching the sacrificial portion so that the component is suspended over the source substrate by the at least one tether, each of the at least one tether being connected to an anchor adjacent to the sacrificial portion.

15. The stamp of claim 1, wherein the lateral post protrusion has a distal end comprising PDMS.

16. The stamp of claim 1, wherein the stamp post has a non-rectangular polygonal distal end.

17. The stamp of claim 1, wherein the stamp posts have a distal stamp post end at which the lateral post protrusion terminates.

18. The stamp of claim 1, wherein the stamp body comprises an elastomer.

19. A method of micro-transfer printing, comprising:
providing a source substrate comprising sacrificial portions disposed in an array over the source substrate, the sacrificial portions laterally separated by anchors;
providing a component disposed directly on or over each of the sacrificial portions and physically connected to an anchor with a tether, each component having a component extent and spaced apart from a neighboring component by a component separation distance;
providing a stamp comprising a stamp body and stamp posts extending away from the stamp body and disposed in an array over the stamp body, each of the stamp posts having a post surface extent on a distal end of the stamp post, wherein the post surface extent is greater than the component extent;
positioning the stamp to locate each stamp post in alignment with a corresponding component and pressing each of the stamp posts against the corresponding component to adhere the corresponding component to the stamp post; and
removing the stamp from the source substrate, thereby fracturing the tether physically connecting the corresponding component and making particles that subsequently adhere to the stamp,
wherein the stamp post comprises a lateral protrusion and positioning the stamp comprises:
positioning the lateral protrusion over one of the at least one tether,
wherein at least a portion of the particles adhere to the lateral protrusion.

20. A method of transfer printing a component, the method comprising:
providing a stamp comprising a stamp post, the stamp post having a post surface extent on a distal end of the stamp post;
providing a component disposed on a source substrate, wherein the component is physically connected to the source substrate by at least one tether and the component has a component extent that is smaller than the post surface extent; and
removing the component from the source substrate, wherein removing the component comprises contacting the component to the stamp post and breaking or separating the at least one tether thereby causing particles to form, and wherein at least a portion of the particles adhere to the stamp post while the stamp post is in contact with the component,
wherein the stamp post comprises a lateral post protrusion and the method comprises positioning the lateral post protrusion over one of the at least one tether, wherein at least a portion of the particles adhere to the lateral protrusion while the stamp post is in contact with the component.

21. The stamp of claim 2, wherein the step extends laterally beyond each edge of a distal end of the stamp post.

22. The stamp of claim 2, wherein the stamp body comprises an elastomer.

* * * * *